(12) United States Patent
Lee et al.

(10) Patent No.: US 12,349,366 B2
(45) Date of Patent: Jul. 1, 2025

(54) INTERFACE FILM TO MITIGATE SIZE EFFECT OF MEMORY DEVICE

(71) Applicant: Taiwan Semiconductor Manufacturing Company, Ltd., Hsinchu (TW)

(72) Inventors: Bi-Shen Lee, Hsinchu (TW); Yi Yang Wei, Hsinchu (TW); Hai-Dang Trinh, Hsinchu (TW); Hsun-Chung Kuang, Hsinchu (TW); Cheng-Yuan Tsai, Chu-Pei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/359,308

(22) Filed: Jul. 26, 2023

(65) Prior Publication Data

US 2024/0023344 A1    Jan. 18, 2024

Related U.S. Application Data

(62) Division of application No. 17/373,886, filed on Jul. 13, 2021, now Pat. No. 12,035,537.

(60) Provisional application No. 63/187,465, filed on May 12, 2021.

(51) Int. Cl.
*H10B 53/30*    (2023.01)
*H10D 1/68*    (2025.01)

(52) U.S. Cl.
CPC ............. *H10B 53/30* (2023.02); *H10D 1/692* (2025.01)

(58) Field of Classification Search
None
See application file for complete search history.

(56) References Cited

U.S. PATENT DOCUMENTS

| 6,151,240 | A | 11/2000 | Suzuki |
| 6,307,731 | B1 | 10/2001 | Katori |
| 7,348,619 | B2 | 3/2008 | Bruchhaus et al. |

(Continued)

FOREIGN PATENT DOCUMENTS

| JP | 2008094707 A | 4/2008 |
| KR | 100247474 B1 | 3/2000 |

OTHER PUBLICATIONS

Notice of Allowance dated Mar. 4, 2024, for U.S. Appl. No. 17/373,886.
Sharma et al. "Atomic Layer Deposition of HfO2 Using HfCp(NMe2) and O2 Plasma" J. Vac. Sci. Technol. A, vol. 35, No. 1, Jan./Feb. 2017. Published on Dec. 20, 2016.

(Continued)

*Primary Examiner* — Vincent Wall
(74) *Attorney, Agent, or Firm* — Eschweiler & Potashnik, LLC

(57) ABSTRACT

In some embodiments, the present disclosure relates to an integrated chip. The integrated chip includes a lower electrode structure disposed over one or more interconnects. The one or more interconnects are arranged within a lower inter-level dielectric (ILD) structure over a substrate. A barrier is arranged along a lower surface of the lower electrode structure. The barrier separates the lower electrode structure from the one or more interconnects. An amorphous initiation layer is over the lower electrode layer and a ferroelectric material is on the amorphous initiation layer. The ferroelectric material has a substantially uniform orthorhombic crystalline phase. An upper electrode is over the ferroelectric material.

20 Claims, 20 Drawing Sheets

(56) References Cited

U.S. PATENT DOCUMENTS

| | | | |
|---|---|---|---|
| 10,164,182 B1 | 12/2018 | Trinh et al. | |
| 10,600,808 B2 | 3/2020 | Schroeder | |
| 2002/0011615 A1 | 1/2002 | Nagata et al. | |
| 2006/0073613 A1 | 4/2006 | Aggarwal et al. | |
| 2007/0046152 A1 | 3/2007 | Ifuku et al. | |
| 2009/0061538 A1* | 3/2009 | Heo | H01L 28/56 257/E21.011 |
| 2011/0018100 A1 | 1/2011 | Nakagawa et al. | |
| 2014/0355328 A1* | 12/2014 | Muller | G11C 11/2275 257/295 |
| 2015/0076437 A1 | 3/2015 | Tao et al. | |
| 2015/0221658 A1 | 8/2015 | Wang | |
| 2016/0118585 A1 | 4/2016 | Jameson et al. | |
| 2016/0148974 A1* | 5/2016 | Lee | H10N 50/01 257/421 |
| 2018/0166453 A1 | 6/2018 | Mueller et al. | |
| 2019/0131420 A1* | 5/2019 | Lu | H01L 29/40111 |
| 2019/0244973 A1 | 8/2019 | Yoo | |
| 2019/0355584 A1 | 11/2019 | Yamaguchi | |
| 2020/0035493 A1 | 1/2020 | Clark et al. | |
| 2020/0119047 A1 | 4/2020 | Yoo et al. | |
| 2020/0212068 A1 | 7/2020 | Lee et al. | |
| 2021/0035992 A1 | 2/2021 | Chen et al. | |

OTHER PUBLICATIONS

Shao et al. "The Current Modulation of Anomalous Hall Effect in van der Waals Fe3GeTe2/WTe2 Heterostructures" Appl. Phys. Lett. 116, 092401 (2020), published on Mar. 2, 2020.

Sina, Younes. "Fundamental Studies of Single Crystal Alpha Alumina Microstructures Produced by Irradiation with Zirconium Ions" TRACE: Tennessee Research and Creative Exchange. Published Dec. 2013.

Non-Final Office Action dated Jun. 28, 2023 for U.S. Appl. No. 17/373,886.

Final Office Action dated Oct. 12, 2023 for U.S. Appl. No. 17/373,886.

Silva et al. "Effect of sol-gel processing parameters on structure of zirconia" Cerâmica 65 (2019) Suppl.1 17-21, published in 2019.

Hsain et al. "Compositional dependence of crystallization temperatures and phase evolution in hafnia-zirconia (HfxZr1-x)O2 thin films" Appl. Phys. Lett. 116, 192901 (2020), published on May 11, 2020.

Jakschik et al. "Crystallization behavior of thin ALD-Al2O3 films" Thin Solid Films 425 (2003) 216-220, published on Dec. 10, 2002.

Onaya et al. "Improvement in ferroelectricity of HfxZr1%xO2 thin films using ZrO2 seed layer" Applied Physics Express 10, 081501 (2017), published on Jul. 13, 2017.

\* cited by examiner

INTERFACE FILM TO MITIGATE SIZE EFFECT OF MEMORY DEVICE

REFERENCE TO RELATED APPLICATIONS

This application is a Divisional of U.S. application Ser. No. 17/373,886, filed on Jul. 13, 2021, which claims the benefit of U.S. Provisional Application No. 63/187,465, filed on May 12, 2021. The contents of the above-referenced patent applications are hereby incorporated by reference in their entirety.

BACKGROUND

Many modern-day electronic devices contain electronic memory configured to store data. Electronic memory may be volatile memory or non-volatile memory. Volatile memory stores data when it is powered, while non-volatile memory is able to store data when power is removed. Ferroelectric random-access memory (FeRAM) devices are one promising candidate for a next generation non-volatile memory technology. This is because FeRAM devices provide for many advantages, including a fast write time, high endurance, low power consumption, and low susceptibility to damage from radiation.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
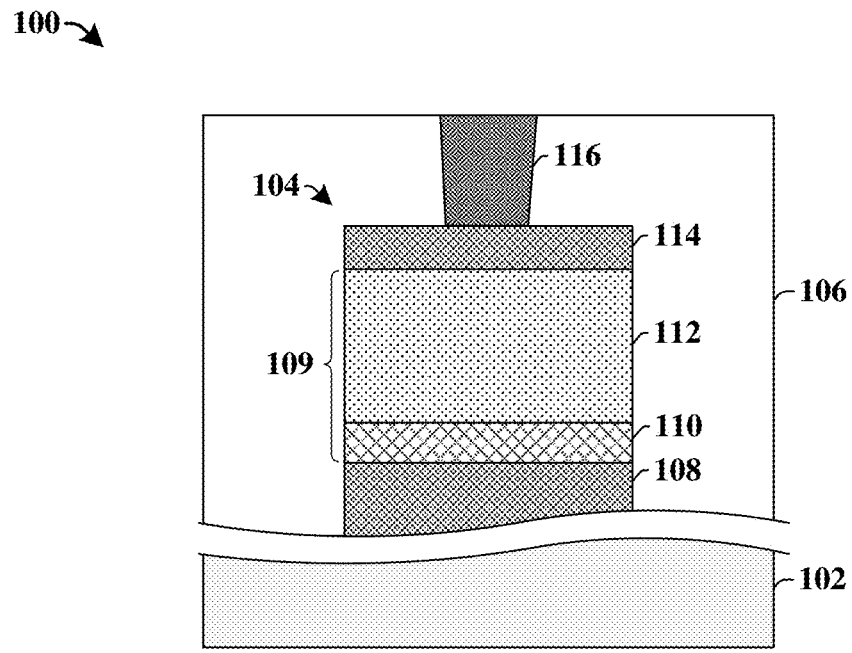
FIG. 1 illustrates a cross-sectional view of some embodiments of an integrated chip having a ferroelectric data storage structure that includes an amorphous initiation layer configured to improve performance of the ferroelectric data storage structure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Ferroelectric random access memory (FeRAM) devices have a lower electrode that is separated from an upper electrode by a ferroelectric data storage structure comprising a ferroelectric material. The ferroelectric material has an intrinsic electric dipole that can be switched between opposite polarities by application of an external electric field. The different polarities provide the FeRAM device with different capacitances, which can be sensed during a read operation by a voltage on a bit-line. The different capacitances are representative of different data states (e.g., a logical '0' or '1'), thereby allowing the FeRAM device to digitally store data.

It has been appreciated that some ferroelectric materials (e.g., hafnium zirconium oxide) used within a ferroelectric data storage structure may be formed to have a plurality of different crystalline phases (e.g., monoclinic, tetragonal, and/or orthorhombic phases) during fabrication due to an influence of an underlying lower electrode. It has been further appreciated that the plurality of different crystalline phases of the ferroelectric material will cause different ferroelectric memory devices within a memory array to have different memory windows (e.g., a difference in voltages on a bit-line between a low data state (e.g., a logical "0") and a high data state (e.g., a logical "1")). For example, a ferroelectric memory device having a having a ferroelectric material that is 78% monoclinic phase, 17% orthorhombic phase, 5% tetragonal phase may have a memory window of 0.2 volts (V), while a ferroelectric memory device having a ferroelectric material that is 16% monoclinic phase, 62% orthorhombic phase, 22% tetragonal phase may have a memory window of 0.7 V. Therefore, a ferroelectric memory device having a ferroelectric material with a low orthorhombic phase may have a relatively small memory window, which makes it difficult to differentiate different data states from one another during a read operation.

As the size of FeRAM devices decrease, variations in orthorhombic phase distribution within ferroelectric data storage structures increase so that there is greater device-to-device variation between different ferroelectric memory devices. For example, below a cell size of approximately 135 nm a relatively large device-to-device variation of the FeRAM devices decreases a memory window of the associated devices and thereby decreases an ability of a sensing circuitry (e.g., a sense amplifier) to differentiate between a low data state (e.g., a logical "0") and a high data state (e.g., a logical "1") during a read operation.

The present disclosure, in some embodiments, relates to an integrated chip having a ferroelectric data storage structure disposed between a lower electrode and an upper electrode. The ferroelectric data storage structure comprises an amorphous initiation layer and a ferroelectric switching layer. The amorphous initiation layer is configured to influence a crystalline phase of the ferroelectric switching layer. By influencing the crystalline phase of the ferroelectric switching layer, the amorphous initiation layer can cause the ferroelectric amorphous initiation layer to be formed to have a substantially uniform orthorhombic phase, thereby reducing device-to-device variations over a memory array and improving a reliability of read operations on the memory array.

FIG. 1 illustrates a cross-sectional view of some embodiments of an integrated chip 100 having a ferroelectric data storage structure that includes an amorphous initiation layer.

The integrated chip 100 comprises a ferroelectric memory device 104 (e.g., an FeRAM device) disposed within a dielectric structure 106 over a substrate 102. The ferroelectric memory device 104 comprises a lower electrode 108 disposed over the substrate 102. A ferroelectric data storage structure 109 is arranged between the lower electrode 108 and an upper electrode 114. The ferroelectric data storage structure 109 is configured to change polarization based upon one or more voltages applied to the lower electrode 108 and/or the upper electrode 114. An upper interconnect 116 extends through the dielectric structure 106 to contact the upper electrode 114.

The ferroelectric data storage structure 109 comprises an amorphous initiation layer 110 and a ferroelectric switching layer 112. In some embodiments, the amorphous initiation layer 110 may directly contact the ferroelectric switching layer 112. In some embodiments, the amorphous initiation layer 110 may be disposed between the ferroelectric switching layer 112 and the lower electrode 108. In other embodiments (not shown), the amorphous initiation layer 110 may be separated from the lower electrode 108 by the ferroelectric switching layer 112. In some embodiments, the amorphous initiation layer 110 may comprise an amorphous phase.

The amorphous initiation layer 110 is configured to influence a crystalline phase (i.e., a crystal structure) of the ferroelectric switching layer 112 during fabrication of the ferroelectric memory device 104. For example, in some embodiments the amorphous initiation layer 110 may be configured to act as a nucleation site that influences a crystalline phase of the ferroelectric switching layer 112 during fabrication of the ferroelectric memory device 104 (e.g., during epitaxial growth of the ferroelectric switching layer 112). In some embodiments, the amorphous initiation layer 110 is configured to prevent interaction between the ferroelectric switching layer 112 and the lower electrode 108, thereby preventing the lower electrode 108 from influencing a crystalline structure of the ferroelectric switching layer 112 and allowing the ferroelectric switching layer 112 to be formed to have an amorphous phase (i.e., amorphous structure). In some such embodiments, a subsequent anneal process is configured to transform the amorphous phase of the ferroelectric switching layer 112 to an orthorhombic crystalline structure, thereby giving the ferroelectric switching layer 112 a substantially uniform orthorhombic phase (e.g., giving the ferroelectric switching layer a predominately orthorhombic phase).

By influencing the crystalline phase of the ferroelectric switching layer 112, the amorphous initiation layer 110 is able to cause the ferroelectric switching layer 112 to have a substantially uniform crystalline phase. In some embodiments, the substantially uniform orthorhombic crystalline phase extends between outermost surfaces (e.g., outermost sidewalls and/or top and bottom surfaces) of the ferroelectric switching layer 112. The substantially uniform crystalline phase can reduce device-to-device variations in crystalline phase that may occur over a memory array. Reducing the device-to-device variations mitigates decreases in memory windows as a size of the memory devices decrease, thereby improving a performance (e.g., a read window) of the integrated chip 100.

Figure 2:
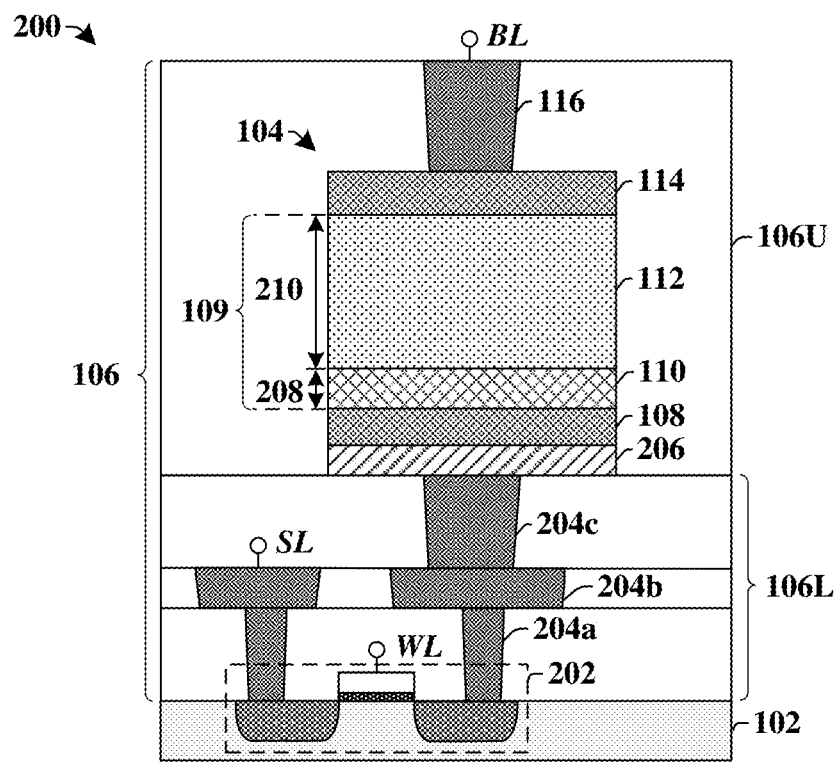
FIG. 2 illustrates a cross-sectional view of some additional embodiments of an integrated chip having a ferroelectric data storage structure that includes an amorphous initiation layer.

FIG. 2 illustrates a cross-sectional view of some additional embodiments of an integrated chip 200 having a ferroelectric data storage structure that includes an amorphous initiation layer.

The integrated chip 200 includes a ferroelectric memory device 104 disposed within a dielectric structure 106 comprising a plurality of stacked inter-level dielectric (ILD) layers over a substrate 102. In some embodiments, the plurality of stacked ILD layers may comprise one or more lower ILD layers 106L arranged between the ferroelectric memory device 104 and the substrate 102, and an upper ILD layer 106U surrounding the ferroelectric memory device 104. In some embodiments, the one or more lower ILD layers 106L surround one or more lower interconnects 204a-204c. In some embodiments, an upper interconnect 116 extends through the upper ILD layer 106U to contact the ferroelectric memory device 104.

In some embodiments, the one or more lower interconnects 204a-204c may couple the ferroelectric memory device 104 to an access device 202. In various embodiments, the access device 202 may comprise a unipolar selector (e.g., a diode), a bipolar selector (e.g., a transistor device disposed within the substrate 102), or the like. In some embodiments, the access device 202 may comprise a planar FET, a FinFET, a gate all around structure (GAA) transistor, a nanosheet transistor, or the like. In some such embodiments, the one or more lower interconnects 204a-204c may couple the ferroelectric memory device 104 to a source-line SL, the access device 202 may couple the ferroelectric memory device 104 to a word-line WL, and the upper interconnect 116 may couple the ferroelectric memory device 104 to a bit-line BL.

In some embodiments, the one or more lower interconnects 204a-204c and/or the upper interconnect 116 may comprise a conductive contact 204a, an interconnect wire 204b, and/or an interconnect via 204c. In some embodiments, the one or more lower interconnects 204a-204c and the upper interconnect 116 may comprise tungsten, aluminum, copper, ruthenium, and/or the like. In some embodiments, the plurality of stacked ILD layers may comprise a nitride (e.g., silicon nitride, silicon oxynitride), a carbide (e.g., silicon carbide), an oxide (e.g., silicon oxide), borosilicate glass (BSG), phosphoric silicate glass (PSG), borophosphosilicate glass (BPSG), a low-k oxide (e.g., a carbon doped oxide, Sic OH), or the like.

The ferroelectric memory device 104 comprises a ferroelectric data storage structure 109 disposed between a lower electrode 108 and an upper electrode 114. In some embodiments, the lower electrode 108 may comprise a first metal and the upper electrode 114 may comprise a second metal. In some embodiments, the first metal and/or the second metal may comprise tungsten, tantalum, titanium, tantalum nitride, titanium nitride, ruthenium, platinum, iridium, molybdenum, or the like. In some embodiments, the lower electrode 108 and the upper electrode 114 may respectively have thicknesses of between approximately 10 nanometers (nm) and approximately 100 nm, between approximately 5 nm and approximately 50 nm, or other similar values.

The ferroelectric data storage structure 109 comprises an amorphous initiation layer 110 and a ferroelectric switching layer 112. In some embodiments, the amorphous initiation layer 110 separates the ferroelectric switching layer 112 from the lower electrode 108. In some embodiments, the amorphous initiation layer 110 may comprise silicon oxide (e.g., $SiO_x$), silicon nitride (e.g., $Si_xN_y$), tantalum oxide (e.g., $TaO_x$), tantalum nitride (e.g., TaN), aluminum oxide (e.g., $AlO_x$), aluminum nitride (e.g., AlN), yttrium oxide (e.g., $YO_x$), gadolinium oxide (e.g., $GdO_x$), lanthanum oxide (e.g., $LaO_x$), strontium oxide (e.g., $SrO_x$), or the like. In some embodiments, the ferroelectric switching layer 112 may comprise a high-k dielectric material. For example, in some embodiments, the ferroelectric switching layer 112 may comprise hafnium oxide, hafnium zirconium oxide, zirconium oxide, or the like.

In some embodiments, the amorphous initiation layer 110 may have a thickness 208 that is between approximately 10 Angstroms (Å) and approximately 30 Å. In other embodiments, the thickness 208 may be between approximately 20 Å and approximately 30 Å, between approximately 25 Å and approximately 30 Å, or other similar values. If the thickness 208 of the amorphous initiation layer 110 is greater than approximately 30 Å, an operating voltage of the ferroelectric switching layer 112 will increase. In some embodiments, the ferroelectric switching layer 112 may have a thickness 210 in a range of between approximately 50 Å and approximately 300 Å, between 100 Å and approximately 400 Å, or other similar values.

In some embodiments, the amorphous initiation layer 110 may comprise and/or be a material having a relatively high crystallization temperature. The relatively high crystallization temperature allows for the amorphous initiation layer 110 to remain amorphous during high temperature processes. By having the amorphous initiation layer 110 remain amorphous during high temperature processes, the amorphous initiation layer 110 is able to remain amorphous and influence a phase of the overlying ferroelectric switching layer 112 to be amorphous. In some embodiments, the amorphous initiation layer 110 may have a higher crystallization temperature than the ferroelectric switching layer 112 so that the amorphous initiation layer 110 remains amorphous even while the ferroelectric switching layer 112 changes to a crystalline phase (e.g., an orthorhombic crystalline phase). In some embodiments, the amorphous initiation layer 110 may comprise and/or be a material having a crystallization temperature that is greater than approximately 400 degrees Celsius (° C.), greater than approximately 500° C., greater than approximately 750° C., or other similar values.

In some embodiments, the lower electrode 108 may be separated from the one or more lower interconnects 204a-204b and/or the one or more lower ILD layers 106L by a diffusion barrier 206. In some such embodiments, the diffusion barrier 206 may contact a lower surface of the lower electrode 108. In some embodiments, the diffusion barrier 206 may comprise tantalum nitride, titanium nitride, or the like.

Figure 3A:
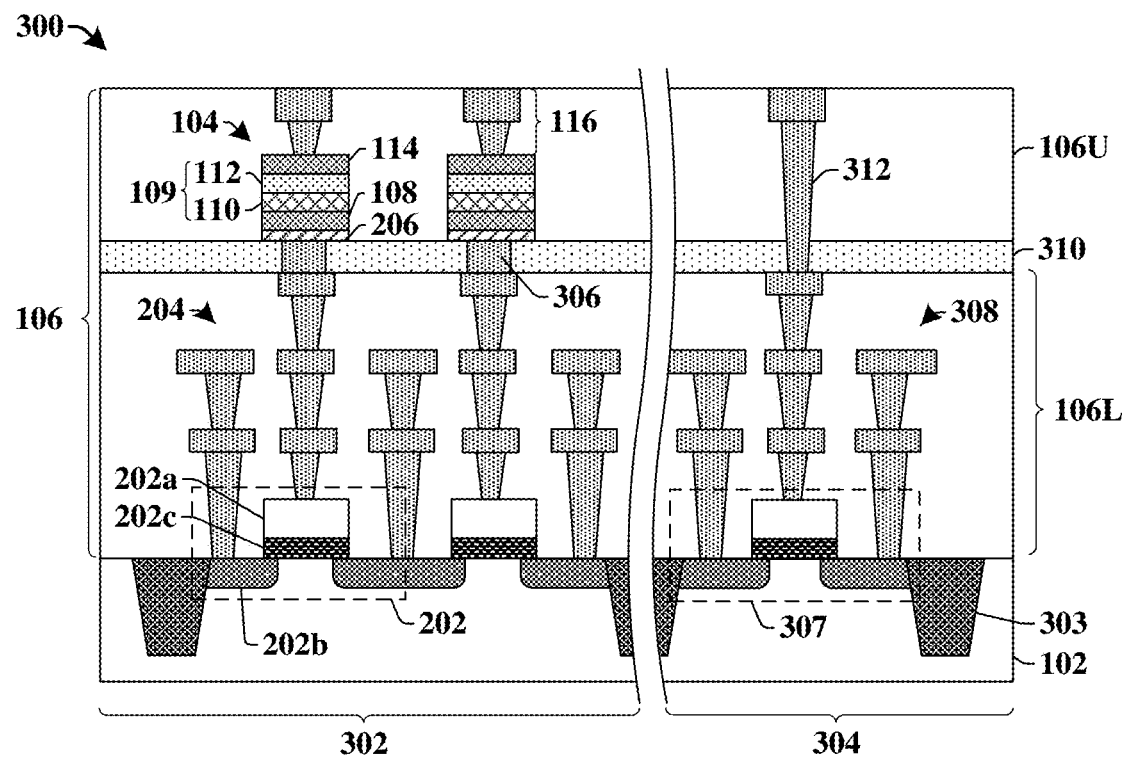
FIGS. 3A-3B illustrate cross-sectional views of some additional embodiments of integrated chips having a ferroelectric data storage structure that includes an amorphous initiation layer.

FIG. 3A illustrates a cross-sectional view of some additional embodiments of an integrated chip 300 having a ferroelectric data storage structure that includes an amorphous initiation layer.

The integrated chip 300 comprises a memory region 302 and a logic region 304. The memory region 302 comprises a ferroelectric memory device 104 disposed within a dielectric structure 106 over a substrate 102. In some embodiments, the ferroelectric memory device 104 may be arranged within an array comprising a plurality of ferroelectric memory devices. The ferroelectric memory device 104 is coupled to an access device 202 by way of one or more lower interconnects 204 within one or more lower ILD layers 106L. In some embodiments, the access device 202 comprises a gate electrode 202a disposed over the substrate 102 and between source/drain regions 202b arranged within the substrate 102. In some embodiments, the gate electrode 202a may be separated from the substrate 102 by way of a gate dielectric 202c. In some embodiments, one or more isolation structures 303 may be disposed within the substrate 102 along opposing sides of the access device 202. The one or more isolation structures 303 are configured to electrically isolate the access device 202 from an adjacent device. In some embodiments, the one or more isolation structures 303 may comprise shallow trench isolation (STI) structures including one or more dielectric materials disposed within one or more trenches defined by sidewalls of the substrate 102.

In some embodiments, a lower insulating structure 310 is disposed over the one or more lower ILD layers 106L. The lower insulating structure 310 comprises sidewalls that define an opening disposed over the one or more lower interconnects 204. A lower electrode via 306 extends through the opening defined by the sidewalls of the lower insulating structure 310. The lower electrode via 306 couples the ferroelectric memory device 104 to the one or more lower interconnects 204.

The ferroelectric memory device 104 comprises a ferroelectric data storage structure 109 disposed between a lower electrode 108 and an upper electrode 114. The ferroelectric data storage structure 109 comprises an amorphous initiation layer 110 and a ferroelectric switching layer 112. In some embodiments, the lower electrode 108, the amorphous initiation layer 110, the ferroelectric switching layer 112, and the upper electrode 114 may comprise substantially planar layers. In such embodiments, the lower electrode 108, the amorphous initiation layer 110, the ferroelectric switching layer 112, and the upper electrode 114 may respectively have a substantially planar lower surface and a substantially planar upper surface laterally extending between outermost sidewalls.

In some embodiments, a diffusion barrier 206 may be disposed between the lower electrode 108 and the lower insulating structure 310. In some embodiments, the diffusion barrier 206 may laterally extend past outermost sidewalls of the lower electrode via 306 to directly over an upper surface of the lower insulating structure 310. In some embodiments, the diffusion barrier 206 may also comprise a substantially planar layer. In some alternative embodiments (not shown), the diffusion barrier 206 may line outer sidewalls and a lower surface of the lower electrode via 306.

The logic region 304 comprises a logic device 307 disposed on and/or within the substrate 102. In some embodiments, the logic device 307 may comprise a transistor device (e.g., a planar FET, a FinFET, a gate all around structure (GAA) transistor, a nanosheet transistor, or the like). In some embodiments, the one or more isolation structures 303 may also be disposed within the substrate 102 along opposing sides of the logic device 307. The logic device 307 is coupled to one or more additional lower interconnects 308 disposed within the one or more lower ILD layers 106L. The one or more additional lower interconnects 308 are further coupled to an interconnect via 312 disposed within the upper ILD layer 106U and extending through the lower insulating structure 310.

Figure 3B:
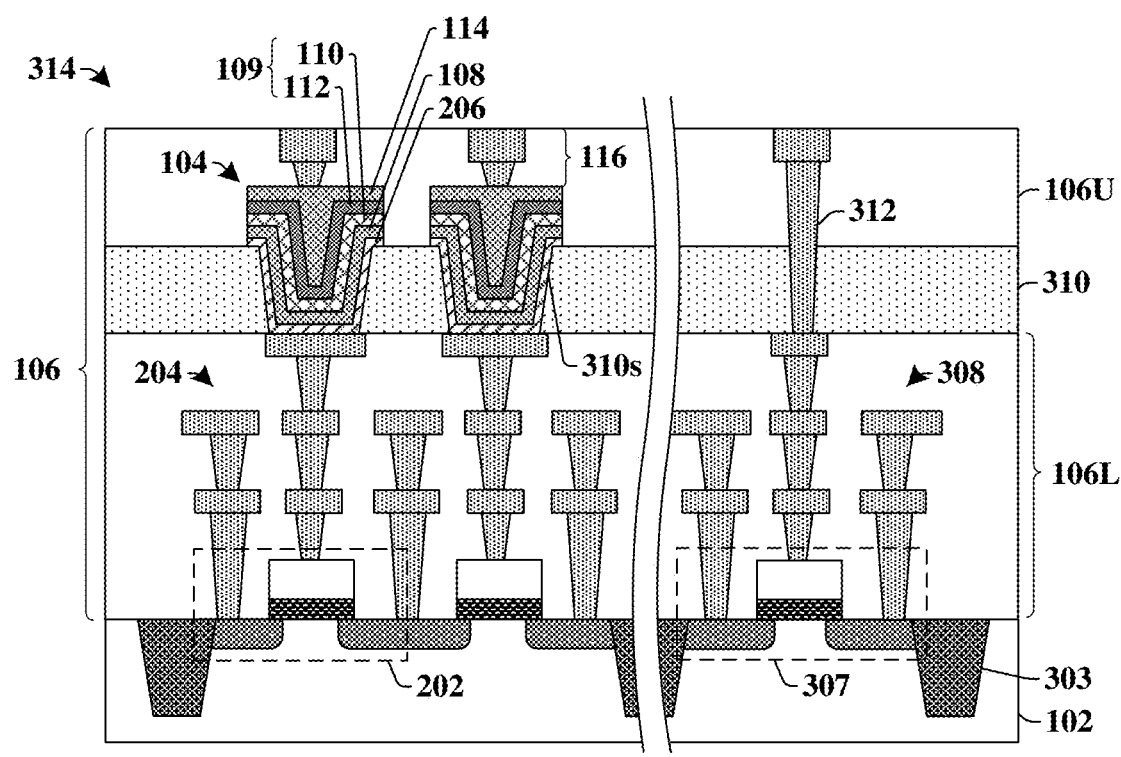

FIG. 3B illustrates a cross-sectional view of some alternative embodiments of an integrated chip 314 having a ferroelectric data storage structure that includes an amorphous initiation layer.

The integrated chip 314 includes a lower insulating structure 310 disposed over one or more lower ILD layers 106L surrounding one or more lower interconnects 204. A ferroelectric memory device 104 is arranged over the lower insulating structure 310. The lower insulating structure 310 comprises one or more sidewalls 310s defining an opening that exposes the one or more lower interconnects 204. In some embodiments, the one or more sidewalls 310s may be angled. In some such embodiments, the one or more sidewalls 310s may be separated from a lower surface of the lower insulating structure 310 by an acute angle, as measured through the lower insulating structure 310.

The ferroelectric memory device 104 comprises a ferroelectric data storage structure 109 disposed between a lower electrode 108 and an upper electrode 114. The ferroelectric data storage structure 109 comprises an amorphous initiation layer 110 and a ferroelectric switching layer 112. In some embodiments, the lower electrode 108, the amorphous initiation layer 110, the ferroelectric switching layer 112, and the upper electrode 114 are conformal layers (e.g., that respectively have a substantially V shaped structure). In some such embodiments, the lower electrode 108 lines the one or more sidewalls 310s of the lower insulating structure 310 defining the opening and has angled interior sidewalls that define a first recess within an upper surface of the lower electrode 108. The amorphous initiation layer 110 lines the angled interior sidewalls of the lower electrode 108 and has angled interior sidewalls that define a second recess within an upper surface of the amorphous initiation layer 110. The ferroelectric switching layer 112 lines the angled interior sidewalls of the amorphous initiation layer 110 and has angled interior sidewalls that define a third recess within an upper surface of the ferroelectric switching layer 112. The upper electrode 114 lines the angled interior sidewalls of the ferroelectric switching layer 112. In some embodiments, the upper electrode 114 may completely fill the third recess.

Because the lower electrode 108, the amorphous initiation layer 110, the ferroelectric switching layer 112, and the upper electrode 114 are conformal layers, they have a surface area that extends in both a lateral direction and a vertical direction. By extending in both lateral and vertical directions, the layers have a greater effective width (i.e., distance between outer sidewalls of a layer as measured along upper surfaces of the layer). The greater effective width increases a size of the ferroelectric switching layer 112 without increasing a footprint of the ferroelectric memory device 104. By increasing a size of the ferroelectric switching layer 112, a probability of getting a more uniform crystalline phase (e.g., orthorhombic phase) within the ferroelectric switching layer 112 increases, thereby improving a performance of the ferroelectric memory device 104.

Figure 4A:
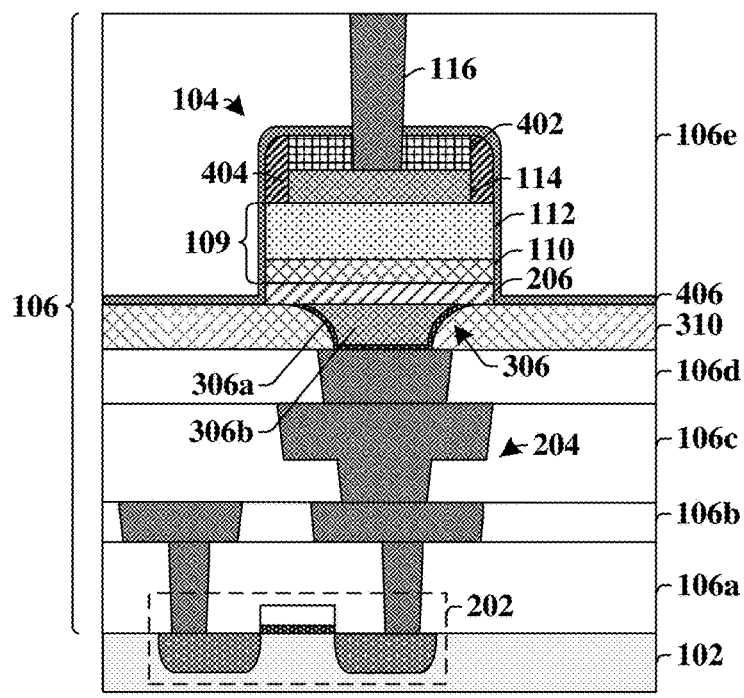
FIGS. 4A-4C illustrate cross-sectional views of some additional embodiments of integrated chips having a ferroelectric data storage structure that includes an amorphous initiation layer.

FIG. 4A illustrates a cross-sectional view of some additional embodiments of an integrated chip 400 having a ferroelectric data storage structure that includes an amorphous initiation layer.

The integrated chip 400 comprises a ferroelectric memory device 104 disposed within a dielectric structure 106 arranged over a substrate 102. In some embodiments, the dielectric structure 106 comprises a plurality of stacked inter-level dielectric (ILD) layers 106a-106e. The plurality of stacked ILD layers 106a-106e comprise one or more lower ILD layers 106a-106d and an upper ILD layer 106e. The one or more lower ILD layers 106a-106d laterally surround one or more lower interconnects 204 configured to couple the ferroelectric memory device 104 to an access device 202.

In some embodiments, a lower insulating structure 310 is disposed over the one or more lower ILD layers 106a-106d. The lower insulating structure 310 comprises sidewalls that form an opening extending through the lower insulating structure 310. In various embodiments, the lower insulating structure 310 may comprise one or more of silicon nitride, silicon dioxide, silicon carbide, or the like. In some embodiments, an upper insulating structure 406 is disposed over the ferroelectric memory device 104 and on the lower insulating structure 310. The upper insulating structure 406 continuously extends from a first position directly over the ferroelectric memory device 104 to a second position abutting an upper surface of the lower insulating structure 310. The upper insulating structure 406 separates the ferroelectric memory device 104 from the upper ILD layer 106e. In some embodiments, the upper insulating structure 406 may comprise one or more of silicon nitride, silicon dioxide, silicon carbide, Tetraethyl orthosilicate (TEOS), or the like.

A lower electrode via 306 extends through the lower insulating structure 310. In some embodiments, the lower electrode via 306 may comprise a diffusion barrier layer 306a and a lower electrode via layer 306b over the diffusion barrier layer 306a. The ferroelectric memory device 104 is arranged over the lower electrode via 306 and the lower insulating structure 310. In some embodiments, the ferroelectric memory device 104 comprises a lower electrode 108 that is separated from an upper electrode 114 by way of a ferroelectric data storage structure 109. In some embodiments, the ferroelectric data storage structure 109 may comprise an amorphous initiation layer 110 and a ferroelectric switching layer 112.

In some embodiments, a hard mask 402 may be disposed on the upper electrode 114. In some embodiments, one or more sidewall spacers 404 may be disposed on opposing sides of the upper electrode 114 and the hard mask 402. The hard mask 402 may comprise a metal (e.g., titanium, tantalum, or the like) and/or a dielectric (e.g., a nitride, a carbide, or the like). The one or more sidewall spacer 404 may comprise an oxide (e.g., silicon rich oxide), a nitride (e.g., silicon nitride), a carbide (e.g., silicon carbide), or the like. In some embodiments, the upper interconnect 116 extends through the upper ILD layer 106e and the hard mask 402 to electrically contact the upper electrode 114.

Figure 4B:
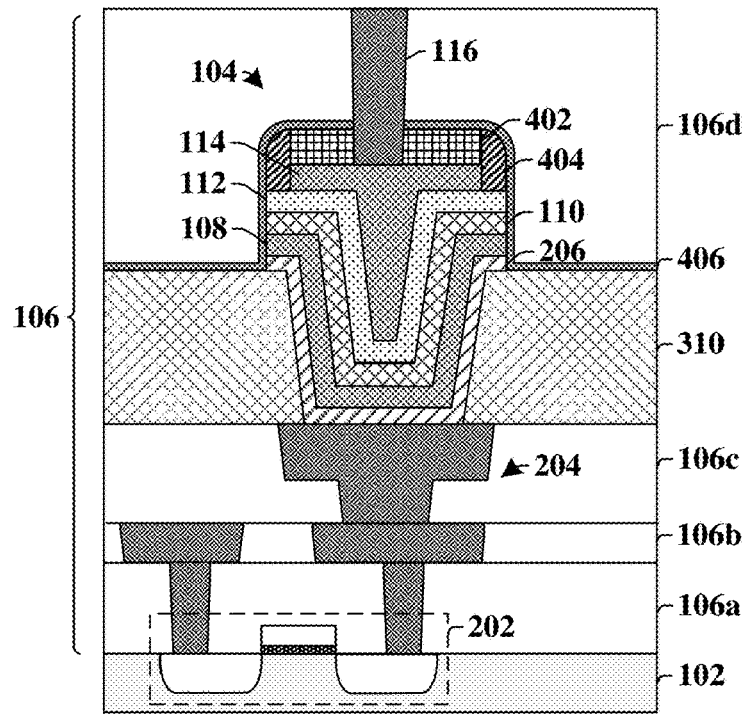

FIG. 4B illustrates a cross-sectional view of some alternative embodiments of an integrated chip 408 having a ferroelectric data storage structure that includes an amorphous initiation layer.

The integrated chip 408 comprises a ferroelectric memory device 104 disposed within a dielectric structure 106 arranged over a substrate 102. The ferroelectric memory device 104 comprises a ferroelectric data storage structure 109 disposed between a lower electrode 108 and an upper electrode 114. The ferroelectric data storage structure 109 comprises an amorphous initiation layer 110 and a ferroelectric switching layer 112. The lower electrode 108, the amorphous initiation layer 110, the ferroelectric switching layer 112, and the upper electrode 114 are conformal layers (e.g., that respectively have a substantially V shaped structure).

Figure 4C:
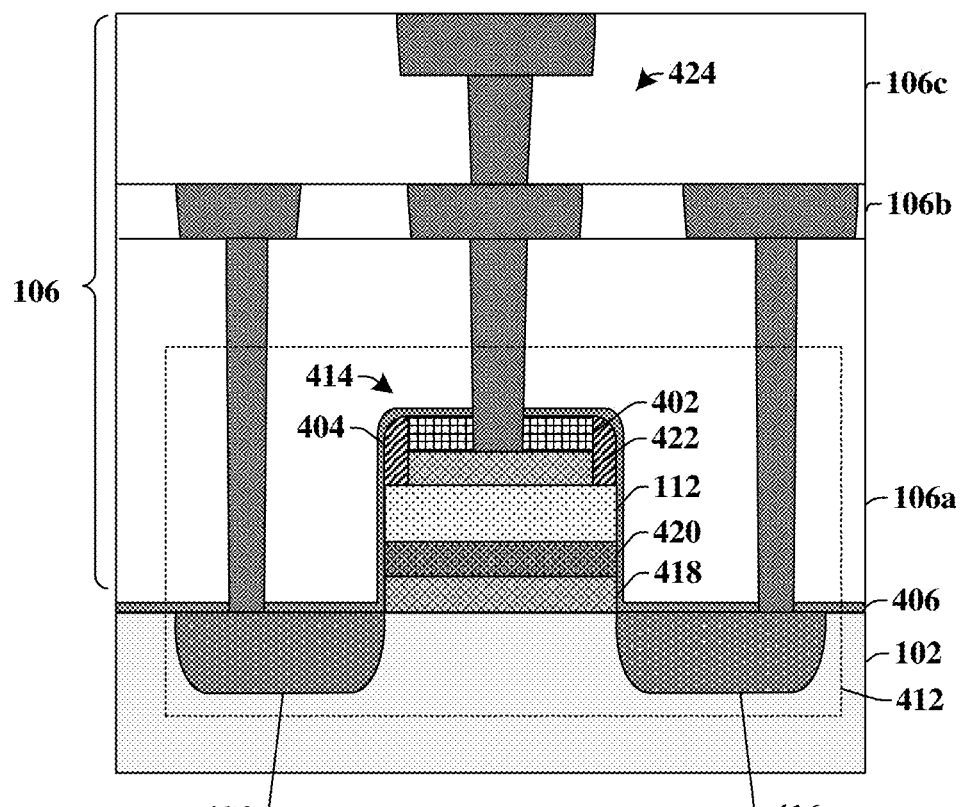

It will be appreciated that in various embodiments, the disclosed ferroelectric data storage structure may be disposed within different types of devices (e.g., FRAM, FTJ devices, MTJ devices, DRAM devices, FeFET devices, or the like). For example, FIG. 4C illustrates a cross-sectional view of some additional embodiments of an integrated chip 410 having a disclosed ferroelectric data storage structure arranged within a FeFET device 412.

The FeFET device 412 has a gate structure 414 disposed between source/drain regions 416 within a substrate 102. The gate structure 414 comprises a gate dielectric 418 disposed on the substrate 102, and a conductive material 420 disposed on the gate dielectric 418. An amorphous initiation layer 110 is disposed on the conductive material 420 and a ferroelectric switching layer 112 is disposed on the amorphous initiation layer 110. A gate electrode 422 is disposed on the ferroelectric switching layer 112. One or more upper interconnects 424 are disposed within a dielectric structure 106 over the substrate 102. The one or more upper interconnects 424 contact the gate electrode 422.

In some embodiments, the gate dielectric 418 may comprise an oxide, such as silicon oxide, silicon oxynitride, or the like. In some embodiments, the conductive material 420 and/or the gate electrode 422 may comprise titanium nitride, tantalum nitride, tungsten, ruthenium, or the like. In some embodiments, the ferroelectric switching layer 112 may comprise hafnium oxide, hafnium zirconium oxide, zirconium oxide, lead zirconate titanate (PZT), or the like. In some embodiments, the conductive material 420 may comprise titanium nitride, tantalum nitride, tungsten, ruthenium, or the like.

In some alternative embodiments, the disclosed ferroelectric data storage structure may be used in a memory device may comprising an FRAM device. In such embodiments, the upper electrode and the lower electrode may respectively comprise one or more of titanium nitride, tantalum nitride, tungsten, ruthenium, or the like. In some such embodiments, the ferroelectric switching layer may comprise hafnium oxide, hafnium zirconium oxide, zirconium oxide, PZT, or the like.

In other alternative embodiments, the disclosed ferroelectric data storage structure may be used in a memory device may comprising an FTJ device. In such embodiments, the upper electrode and the lower electrode may respectively comprise one or more of titanium nitride, tantalum nitride, tungsten, ruthenium, platinum, niobium doped strontium titanate (Nb: STO), or the like. In some such embodiments, the ferroelectric switching layer may comprise hafnium oxide, hafnium zirconium oxide, zirconium oxide, PZT, barium titanate, or the like.

In yet other alternative embodiments, the disclosed ferroelectric data storage structure may be used in a memory device may comprising an MTJ device. In such embodiments, the upper electrode and the lower electrode may respectively comprise one or more of titanium nitride, tantalum nitride, tungsten, ruthenium, or the like. In some such embodiments, the ferroelectric switching layer may comprise hafnium oxide, hafnium zirconium oxide, zirconium oxide, or the like.

In yet other alternative embodiments, the disclosed ferroelectric data storage structure may be used in a memory device may comprising a DRAM device. In such embodiments, the upper electrode and the lower electrode may respectively comprise one or more of titanium nitride, tantalum nitride, tungsten, ruthenium, or the like. In some such embodiments, the ferroelectric switching layer may comprise hafnium oxide, hafnium zirconium oxide, aluminum hafnium zirconium oxide, niobium oxide, or the like.

Figure 5:
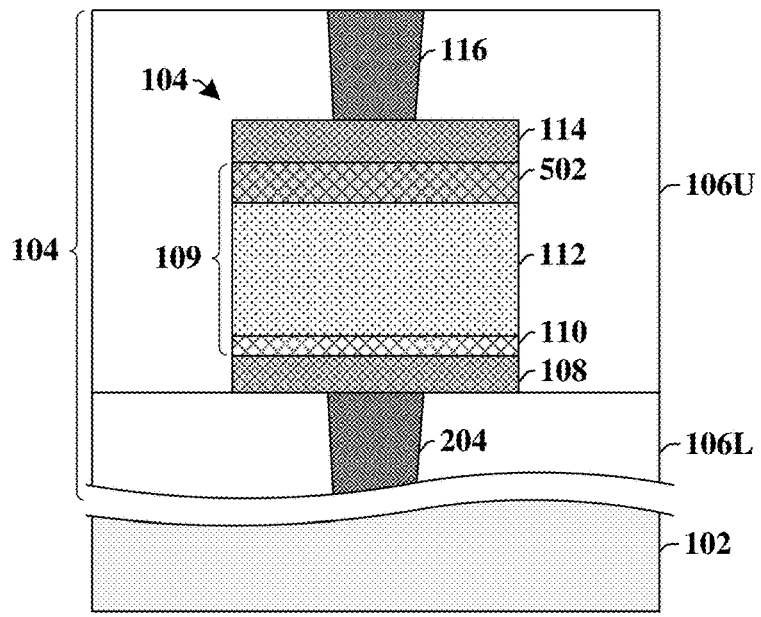
FIGS. 5-7 illustrates cross-sectional views of some additional embodiments of integrated chips having a ferroelectric data storage structure that includes a plurality of amorphous initiation layers.

FIG. 5 illustrates some additional embodiments of an integrated chip 500 having a ferroelectric memory device comprising a ferroelectric data storage structure that includes a plurality of amorphous initiation layers.

The integrated chip 500 comprises a ferroelectric memory device 104 disposed within a dielectric structure 106 over a substrate 102. The ferroelectric memory device 104 has a ferroelectric data storage structure 109 disposed between a lower electrode 108 and an upper electrode 114. The ferroelectric data storage structure 109 comprises an amorphous initiation layer 110 disposed on the lower electrode 108, a ferroelectric switching layer 112 disposed on the amorphous initiation layer 110, and a second amorphous initiation layer 502 disposed on the ferroelectric switching layer 112. In some embodiments, the amorphous initiation layer 110 contacts the lower electrode 108 and the second amorphous initiation layer 502 contacts the upper electrode 114. In some embodiments, the ferroelectric switching layer 112 may continuously extend from a lower surface contacting the amorphous initiation layer 110 to an upper surface contacting the second amorphous initiation layer 502.

In some embodiments, the amorphous initiation layer 110 and the second amorphous initiation layer 502 may comprise and/or be a same material. For example, in some embodiments the amorphous initiation layer 110 and the second amorphous initiation layer 502 may comprise aluminum oxide. In other embodiments, the amorphous initiation layer 110 may comprise a first material and the second amorphous initiation layer 502 may comprise a second material that is different than the first material. For example, in some embodiments the amorphous initiation layer 110 may comprise tantalum nitride and the second amorphous initiation layer 502 may comprise aluminum oxide.

Figure 6:
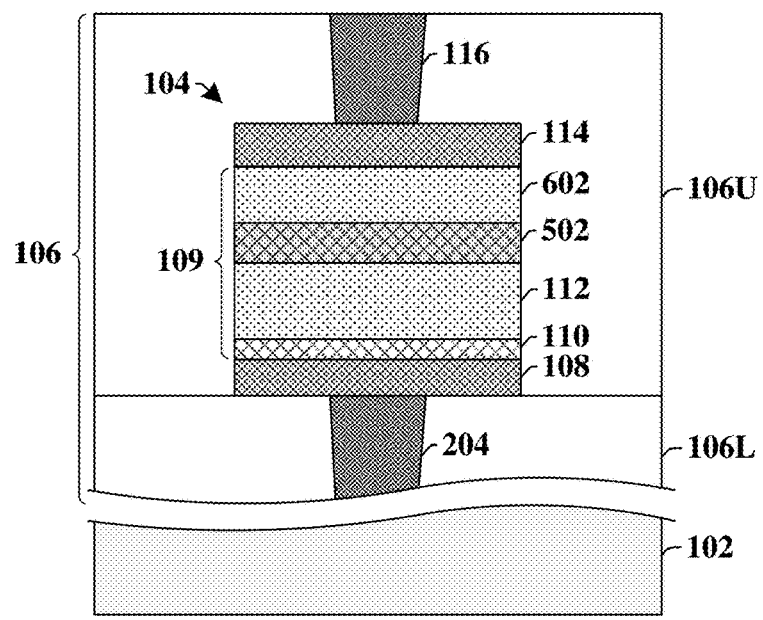

FIG. 6 illustrates some additional embodiments of an integrated chip 600 having a ferroelectric memory device comprising a ferroelectric data storage structure that includes a plurality of amorphous initiation layers.

The integrated chip 600 comprises a ferroelectric memory device 104 disposed within a dielectric structure 106 over a substrate 102. The ferroelectric memory device 104 has a ferroelectric data storage structure 109 disposed between a lower electrode 108 and an upper electrode 114. The ferroelectric data storage structure 109 comprises an amorphous initiation layer 110 disposed on the lower electrode 108, a ferroelectric switching layer 112 disposed on the amorphous initiation layer 110, a second amorphous initiation layer 502 disposed on the ferroelectric switching layer 112, and a second ferroelectric switching layer 602 disposed on the second amorphous initiation layer 502. In some embodiments, the amorphous initiation layer 110 contacts the lower electrode 108 and the second ferroelectric switching layer 602 contacts the upper electrode 114. In some embodiments, the ferroelectric switching layer 112 may continuously extend from a lower surface contacting the amorphous initiation layer 110 to an upper surface contacting the second amorphous initiation layer 502, and the second ferroelectric switching layer 602 may continuously extend from a lower surface contacting the second amorphous initiation layer 502 to an upper surface contacting the upper electrode 114.

In some embodiments, the ferroelectric switching layer 112 and the second ferroelectric switching layer 602 may comprise and/or be a same material. For example, in some embodiments the ferroelectric switching layer 112 and the second ferroelectric switching layer 602 may comprise hafnium zirconium oxide. In other embodiments, the ferroelectric switching layer 112 may comprise a first material and the second ferroelectric switching layer 602 may comprise a second material that is different than the first material. In some embodiments, the ferroelectric switching layer 112 and the second ferroelectric switching layer 602 may both have substantially orthorhombic crystalline phases.

Figure 7:
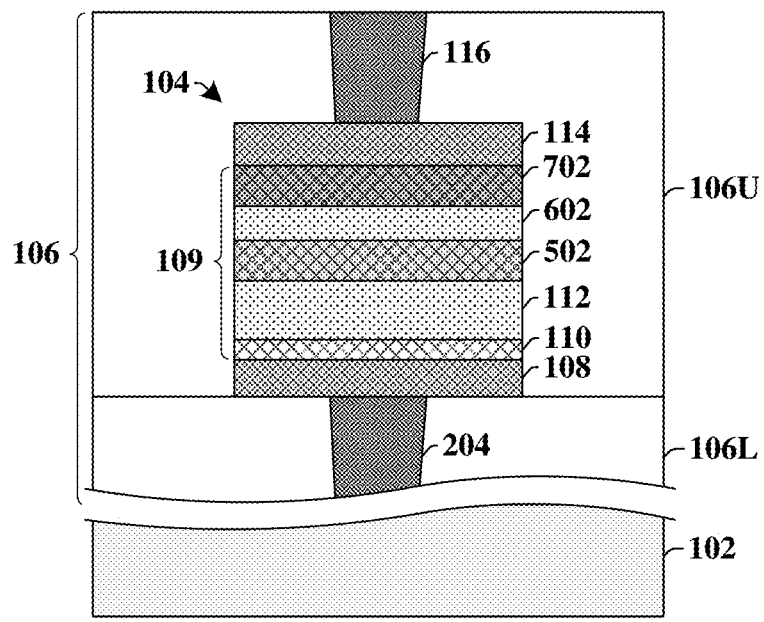

FIG. 7 illustrates some additional embodiments of an integrated chip 700 having a ferroelectric memory device comprising a ferroelectric data storage structure that includes a plurality of amorphous initiation layers.

The integrated chip 700 comprises a ferroelectric memory device 104 disposed within a dielectric structure 106 over a substrate 102. The ferroelectric memory device 104 has a ferroelectric data storage structure 109 disposed between a lower electrode 108 and an upper electrode 114. The ferroelectric data storage structure 109 comprises an amorphous initiation layer 110 disposed on the lower electrode 108, a ferroelectric switching layer 112 disposed on the amorphous initiation layer 110, a second amorphous initiation layer 502 disposed on the ferroelectric switching layer 112, a second ferroelectric switching layer 602 disposed on the second amorphous initiation layer 502, and a third amorphous initiation layer 702 disposed on the second ferroelectric switching layer 602. In some embodiments, the amorphous initiation layer 110 contacts the lower electrode 108 and the third amorphous initiation layer 702 contacts the upper electrode 114. In some embodiments, the ferroelectric switching layer 112 may continuously extend from a lower surface contacting the amorphous initiation layer 110 to an upper surface contacting the second amorphous initiation layer 502, and the second ferroelectric switching layer 602 may continuously extend from a lower surface contacting the second amorphous initiation layer 502 to an upper surface contacting the third amorphous initiation layer 702.

In some embodiments, the amorphous initiation layer 110, the second amorphous initiation layer 502, and the third amorphous initiation layer 702 may comprise and/or be a same material. For example, in some embodiments the amorphous initiation layer 110, the second amorphous initiation layer 502, and the third amorphous initiation layer 702 may comprise aluminum oxide. In other embodiments, one or more of the amorphous initiation layer 110, the second amorphous initiation layer 502, and the third amorphous initiation layer 702 may comprise and/or be different material. For example, in some embodiments the amorphous initiation layer 110 may comprise tantalum nitride, while the second amorphous initiation layer 502 and the third amorphous initiation layer 702 may comprise aluminum oxide.

Figure 8:
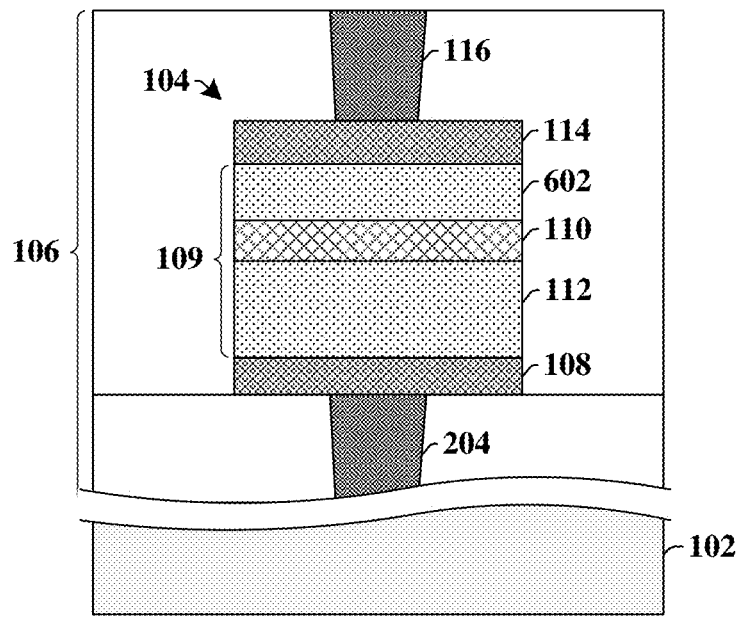
FIG. 8 illustrates a cross-sectional view of some additional embodiments of integrated chips having a ferroelectric data storage structure that includes a plurality of ferroelectric switching layers arranged on opposing sides of an amorphous initiation layer.

FIG. 8 illustrates some additional embodiments of an integrated chip 800 having a ferroelectric memory device comprising a ferroelectric data storage structure that includes a plurality of ferroelectric switching layers separated by an amorphous initiation layer.

The integrated chip 800 comprises a ferroelectric memory device 104 disposed within a dielectric structure 106 over a substrate 102. The ferroelectric memory device 104 has a ferroelectric data storage structure 109 disposed between a lower electrode 108 and an upper electrode 114. The ferroelectric data storage structure 109 comprises a ferroelectric switching layer 112 disposed on the lower electrode 108, an amorphous initiation layer 110 disposed on the ferroelectric switching layer 112, and a second ferroelectric switching layer 602 disposed on the amorphous initiation layer 110. In some embodiments, the ferroelectric switching layer 112 contacts the lower electrode 108 and the second ferroelectric switching layer 602 contacts the upper electrode 114. In some embodiments, the amorphous initiation layer 110 may continuously extend from a lower surface contacting the ferroelectric switching layer 112 to an upper surface contacting the second ferroelectric switching layer 602.

In some embodiments, the ferroelectric switching layer 112 and the second ferroelectric switching layer 602 may comprise and/or be a same material. For example, in some embodiments the ferroelectric switching layer 112 and the second ferroelectric switching layer 602 may comprise hafnium zirconium oxide. In other embodiments, ferroelectric switching layer 112 and the second ferroelectric switching layer 602 may comprise and/or be different materials. In some embodiments, the second ferroelectric switching layer 602 may have a substantially orthorhombic crystalline phase. In some embodiments, the ferroelectric switching layer 112 may have a plurality of different phases.

Figure 9:
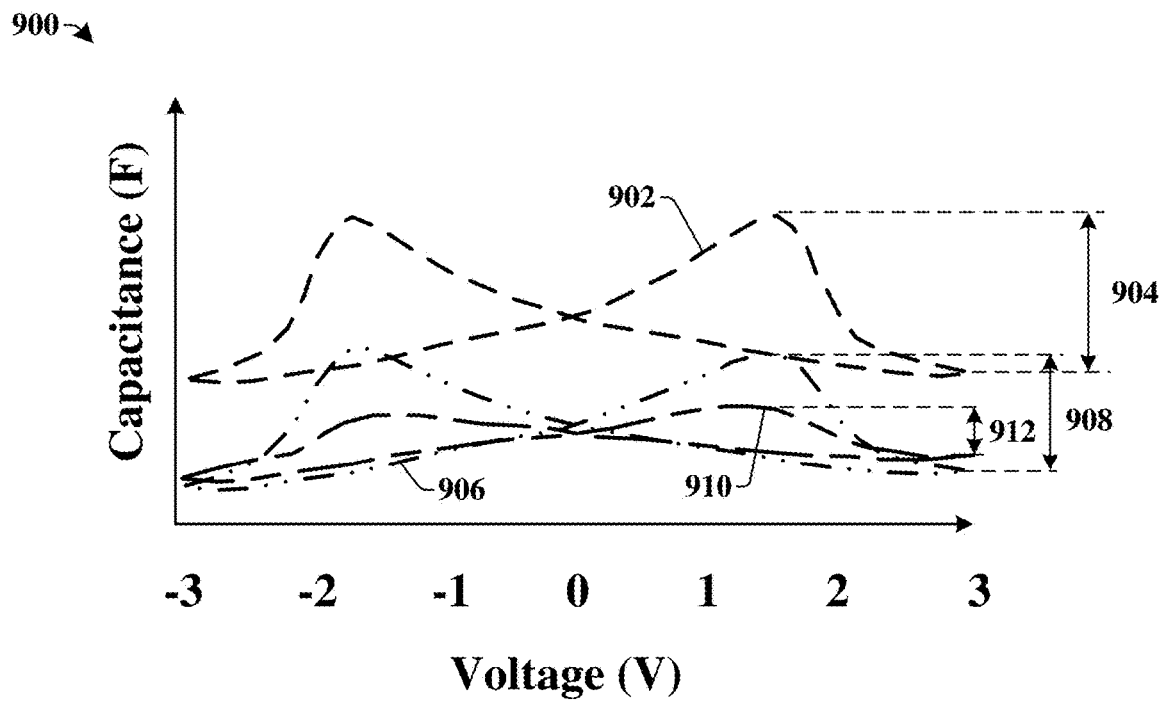
FIG. 9 illustrates a graph showing some embodiments of ferroelectric responses of ferroelectric memory devices having different sizes.

FIG. 9 illustrates a graph 900 showing some embodiments of ferroelectric responses for different sized ferroelectric memory devices that do not have an amorphous initiation layer.

The graph 900 shows a capacitance on a ferroelectric material (y-axis) as a function of a voltage applied over the ferroelectric material (x-axis). As shown in graph 900 as the applied voltage changes the charges stored on the ferroelectric material will change. A ferroelectric response corresponds to a difference between a maximum charge and a minimum charge on the ferroelectric material. The difference in charges stored by the ferroelectric material in turn corresponds to different data states stored by the ferroelectric material. For example, if the ferroelectric material stores charges having a first value the ferroelectric material will store a first data state (e.g., a logical '0'), while if the ferroelectric material stores charges having a second value the ferroelectric material will store a second data state (e.g., a logical '1').

As shown by graph 900, a size of a ferroelectric response differs for different sized ferroelectric memory devices. For example, line 902 shows a ferroelectric response of a ferroelectric memory device associated with a cell size having a large width (e.g., between approximately 500 nm and approximately 550 nm), line 906 shows a ferroelectric response of a ferroelectric memory device associated with a cell size having a medium width (e.g., between approximately 250 nm and approximately 300 nm) that is smaller than the large width, and line 910 shows a ferroelectric response of a ferroelectric memory device associated with a cell size having a small width (e.g., between approximately 100 nm and approximately 150 nm) that is smaller than the medium width.

As shown by line 902, for a ferroelectric memory device associated with a cell size having the large width, the ferroelectric response has a first value 904 that corresponds to a first memory window (e.g., a difference between a high data state and a low data state). The relatively large first value 904 allows for a high data state to be differentiated from a low data state relatively easily. However, as shown by line 906, for a ferroelectric memory device associated with a cell size having the medium width, the ferroelectric response has a second value 908 that is smaller than the first value 904. The second value 908 makes it more difficult to differentiate a high data state from a low data state. Furthermore, as shown by line 910, for a ferroelectric memory device associated with a cell size having the small width, the ferroelectric response has a third value 912 that is smaller than the second value 908. The third value 912 makes it even more difficult to differentiate a high data state from a low data state.

Figure 10:
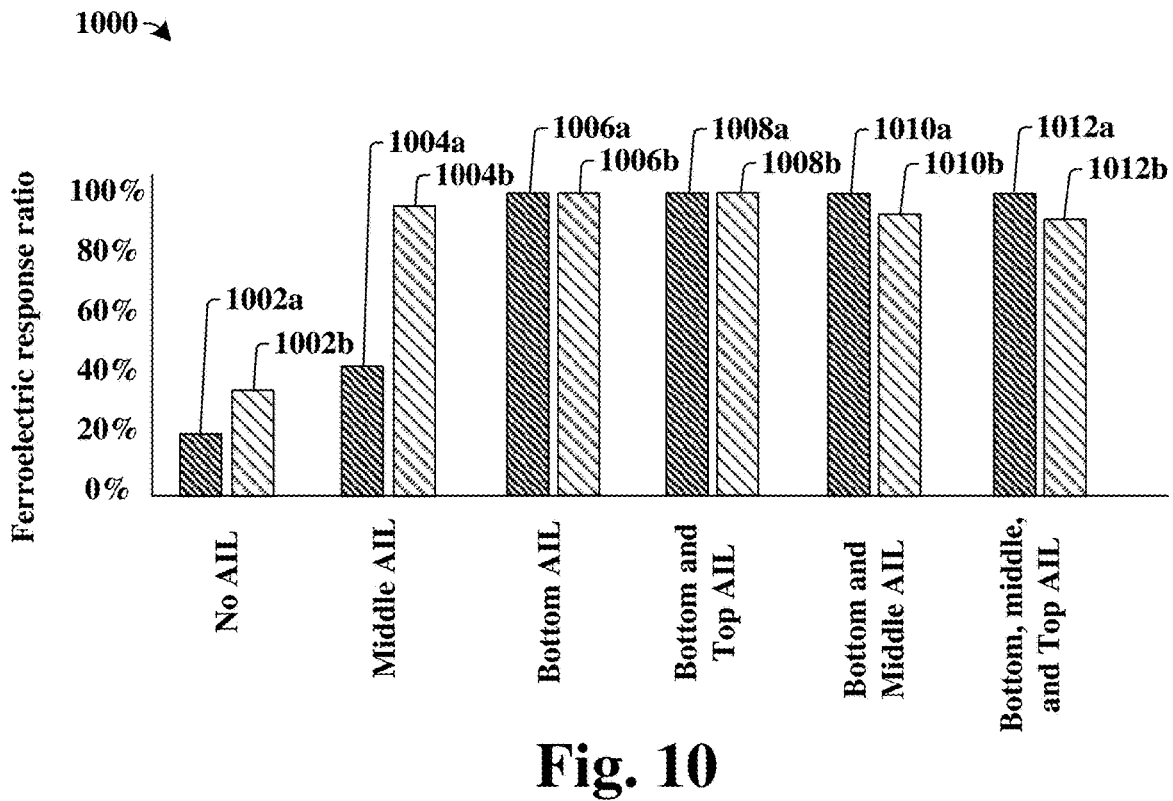
FIG. 10 illustrates a graph showing some embodiments of ferroelectric response ratios of ferroelectric memory devices having different sizes.

FIG. 10 illustrates a bar graph 1000 showing some embodiments of ferroelectric response ratios of ferroelectric memory devices having different sizes.

Bars 1002a-1002b show ratios of ferroelectric responses between different sized ferroelectric memory devices that do not have an amorphous initiation layer (AIL). Bar 1002a shows a ratio of a ferroelectric response of a ferroelectric memory device associated with a small cell size (e.g., associated with line 910 of FIG. 9) and a ferroelectric memory device associated with a large cell size (e.g., associated with line 902 of FIG. 9). Bar 1002b shows ratio of a ferroelectric response of a ferroelectric memory device associated with a medium cell size (e.g., associated with line 906 of FIG. 9) and a ferroelectric memory device associated with a large cell size (e.g., associated with line 902 of FIG. 9). As can be seen by bars 1002a-1002b, the difference in widths of the ferroelectric memory devices cause a large difference in ferroelectric response of a ferroelectric memory device. For example, the ferroelectric response of a ferroelectric memory device associated with a small cell size is approximately 20% of a ferroelectric response of a ferroelectric memory device associated with a large cell size, while the ferroelectric response of a ferroelectric memory device associated with a medium cell size is approximately 40% of the ferroelectric response of the ferroelectric memory device associated with a large cell size.

Bars 1004a-1004b show ratios of ferroelectric responses between different sized ferroelectric memory devices having an amorphous initiation layer that is separated from a lower electrode and an upper electrode by a ferroelectric switching layer (e.g., as shown in FIG. 8). Bar 1004a shows a ratio of a ferroelectric response of a ferroelectric memory device associated with a small cell size and a ferroelectric memory device associated with a large cell size. Bar 1004b shows ratio of a ferroelectric response of a ferroelectric memory device associated with a medium cell size and a ferroelectric memory device associated with a large cell size. As can be seen by bars 1004a-1004b, in some embodiments the ferroelectric response of a ferroelectric memory device associated with a small cell size is approximately 40% of a ferroelectric response of a ferroelectric memory device associated with a large cell size, while the ferroelectric response of a ferroelectric memory device associated with a medium cell size is approximately 90% of the ferroelectric response of the ferroelectric memory device associated with a large cell size. Therefore, the amorphous initiation layer decreases a degradation of the memory window as sizes of a ferroelectric memory device decrease.

Bars 1006a-1006b show ratios of ferroelectric responses between different sized ferroelectric memory devices having an amorphous initiation layer that is in contact with a lower electrode and that is separated from an upper electrode by a ferroelectric switching layer (e.g., as shown in FIG. 1). Bar 1006a shows a ratio of a ferroelectric response of a ferroelectric memory device associated with a small cell size and a ferroelectric memory device associated with a large cell size. Bar 1006b shows ratio of a ferroelectric response of a ferroelectric memory device associated with a medium cell size and a ferroelectric memory device associated with a large cell size. As can be seen by bars 1006a-1006b, in some embodiments the ferroelectric response of a ferroelectric memory device associated with a small cell size is approximately 100% of a ferroelectric response of a ferroelectric memory device associated with a large cell size, while the ferroelectric response of a ferroelectric memory device associated with a medium cell size is approximately 100% of the ferroelectric response of the ferroelectric memory device associated with a large cell size.

Bars 1008a-1008b show ratios of ferroelectric responses between different sized ferroelectric memory devices having a ferroelectric switching layer that is separated from a lower electrode by an amorphous initiation layer and that is further separated from an upper electrode by a second amorphous initiation layer (e.g., as shown in FIG. 5). Bar 1008a shows a ratio of a ferroelectric response of a ferroelectric memory device associated with a small cell size and a ferroelectric memory device associated with a large cell size. Bar 1008b shows ratio of a ferroelectric response of a ferroelectric memory device associated with a medium cell size and a ferroelectric memory device associated with a large cell size. As can be seen by bars 1008a-1008b, in some embodiments the ferroelectric response of a ferroelectric memory device associated with a small cell size is approximately 100% of a ferroelectric response of a ferroelectric memory device associated with a large cell size, while the ferroelectric response of a ferroelectric memory device associated with a medium cell size is approximately 100% of the ferroelectric response of the ferroelectric memory device associated with a large cell size.

Bars 1010a-1010b show ratios of ferroelectric responses between different sized ferroelectric memory devices having an amorphous initiation layer on a lower electrode, a ferroelectric switching layer on the amorphous initiation layer, a second amorphous initiation layer on the ferroelectric switching layer, and a second ferroelectric switching layer on the second amorphous initiation layer (e.g., as shown in FIG. 6). Bar 1010a shows a ratio of a ferroelectric response of a ferroelectric memory device associated with a small cell size and a ferroelectric memory device associated with a large cell size. Bar 1010b shows ratio of a ferroelectric response of a ferroelectric memory device associated with a medium cell size and a ferroelectric memory device associated with a large cell size. As can be seen by bars 1010a-1010b, in some embodiments the ferroelectric response of a ferroelectric memory device associated with a small cell size is approximately 100% of a ferroelectric response of a ferroelectric memory device associated with a large cell size, while the ferroelectric response of a ferroelectric memory device associated with a medium cell size is approximately 90% of the ferroelectric response of the ferroelectric memory device associated with a large cell size.

Bars 1012a-1012b show ratios of ferroelectric responses between different sized ferroelectric memory devices having an amorphous initiation layer on a lower electrode, a ferroelectric switching layer on the amorphous initiation layer, a second amorphous initiation layer on the ferroelectric switching layer, a second ferroelectric switching layer on the second amorphous initiation layer, and a third amorphous initiation layer on the second ferroelectric switching layer (e.g., as shown in FIG. 7). Bar 1012a shows a ratio of a ferroelectric response of a ferroelectric memory device associated with a small cell size and a ferroelectric memory device associated with a large cell size. Bar 1012b shows ratio of a ferroelectric response of a ferroelectric memory device associated with a medium cell size and a ferroelectric memory device associated with a large cell size. As can be seen by bars 1012a-1012b, in some embodiments the ferroelectric response of a ferroelectric memory device associated with a small cell size is approximately 100% of a ferroelectric response of a ferroelectric memory device associated with a large cell size, while the ferroelectric response of a ferroelectric memory device associated with a medium cell size is approximately 90% of the ferroelectric response of the ferroelectric memory device associated with a large cell size.

Therefore, as illustrated by bar graph 1000, the one or more amorphous initiation layers of the disclosed ferroelectric data storage structure decrease a degradation of the memory window as sizes of a ferroelectric memory device decrease, thereby allowing for scaling of the ferroelectric memory devices while maintaining good performance.

Figure 11A:
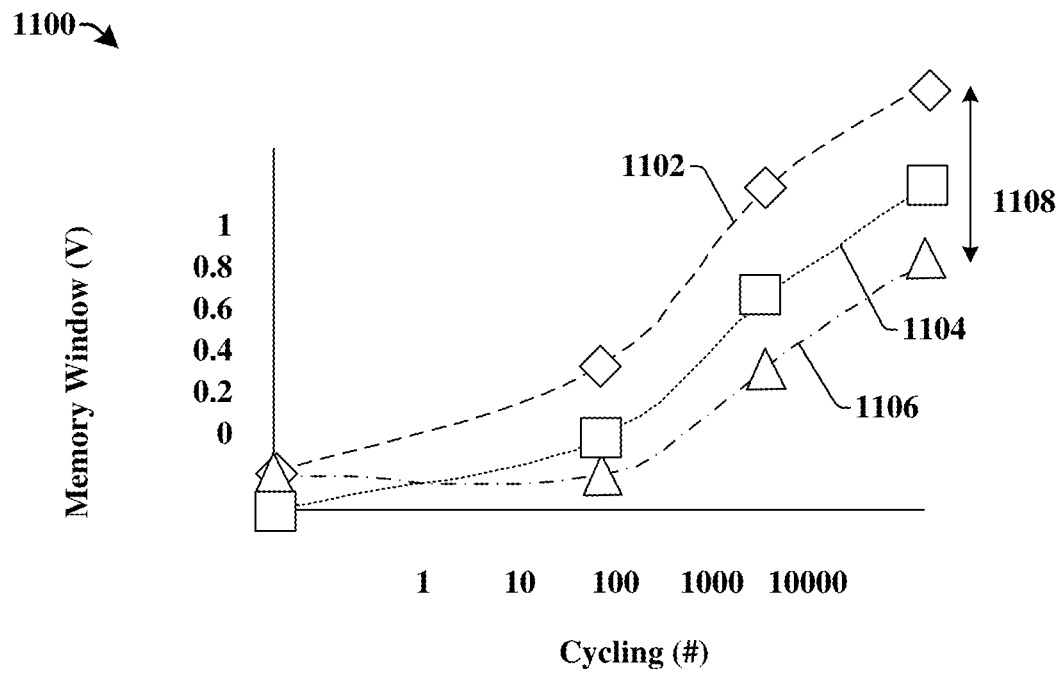
FIGS. 11A-11B illustrate graphs showing some embodiments of memory windows for ferroelectric memory devices over time.

It has been appreciated that the disclosed amorphous initiation layer is also configured to reduce variations of a memory window of a ferroelectric data storage structure over time. For example, FIG. 11A illustrates a graph 1100 showing some embodiments of a memory window of a ferroelectric memory device (x-axis) over a plurality of read/write cycles (y-axis) for ferroelectric memory devices having different sizes. The memory windows shown by graph 1100 are associated with ferroelectric memory devices that do not have a disclosed amorphous initiation layer.

As shown in graph 1100, the memory window is illustrated for a ferroelectric memory device associated with a first cell size (line 1102), for a ferroelectric memory device associated with a second cell size (line 1104) that is smaller than the first cell size, and for a ferroelectric memory device associated with a third cell size (line 1106) that is smaller than the second cell size. The memory window of the ferroelectric memory devices generally increases over time due to defect redistribution. However, as the size of the ferroelectric memory device decreases, a variation in the memory window increases over a first range 1108. As the first range gets large, it becomes more difficult to control reliability of the ferroelectric memory devices.

Figure 11B:
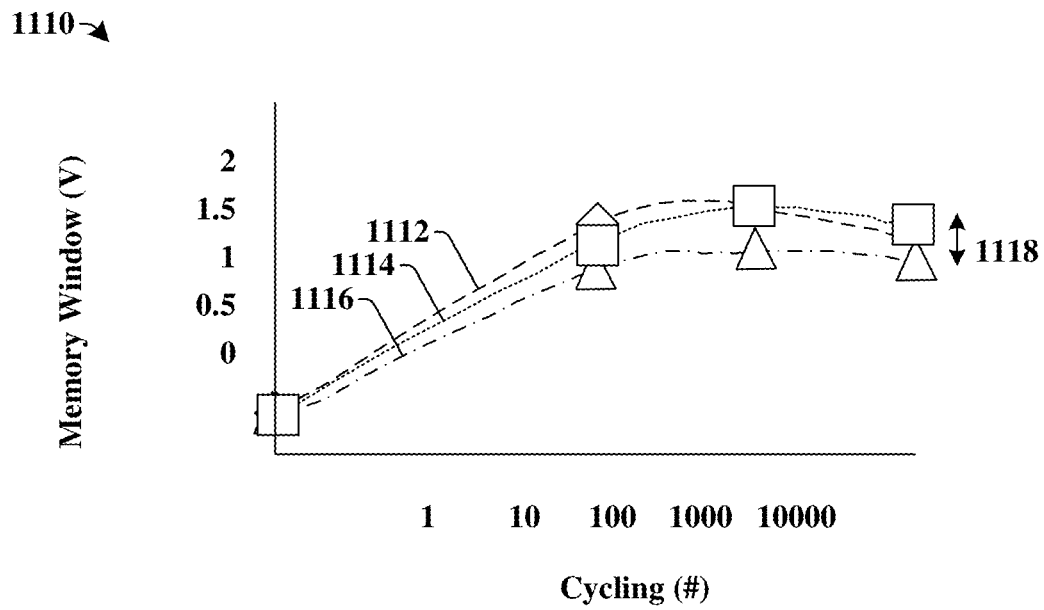

FIG. 11B illustrates a graph 1110 showing some embodiments of a memory window of a ferroelectric memory device (x-axis) over a plurality of read/write cycles (y-axis) for ferroelectric memory devices having different sizes. The memory windows shown by graph 1110 are associated with ferroelectric memory devices that have a disclosed amorphous initiation layer.

As shown in graph 1110, the memory window is illustrated for a ferroelectric memory device associated with a first cell size (line 1112), for a ferroelectric memory device associated with a second cell size (line 1114) that is smaller than the first cell size, and for a ferroelectric memory device associated with a third cell size (line 1116) that is smaller than the second cell size. The memory window of the ferroelectric memory devices generally increases over time due to defect redistribution. However, as the size of the ferroelectric memory devices decrease, a variation in the memory window increases by a second range 1118 that is smaller than the first range (1108 of FIG. 11A). The smaller variation over the memory window of different sized devices improves a reliability of the memory devices.

Figure 12:
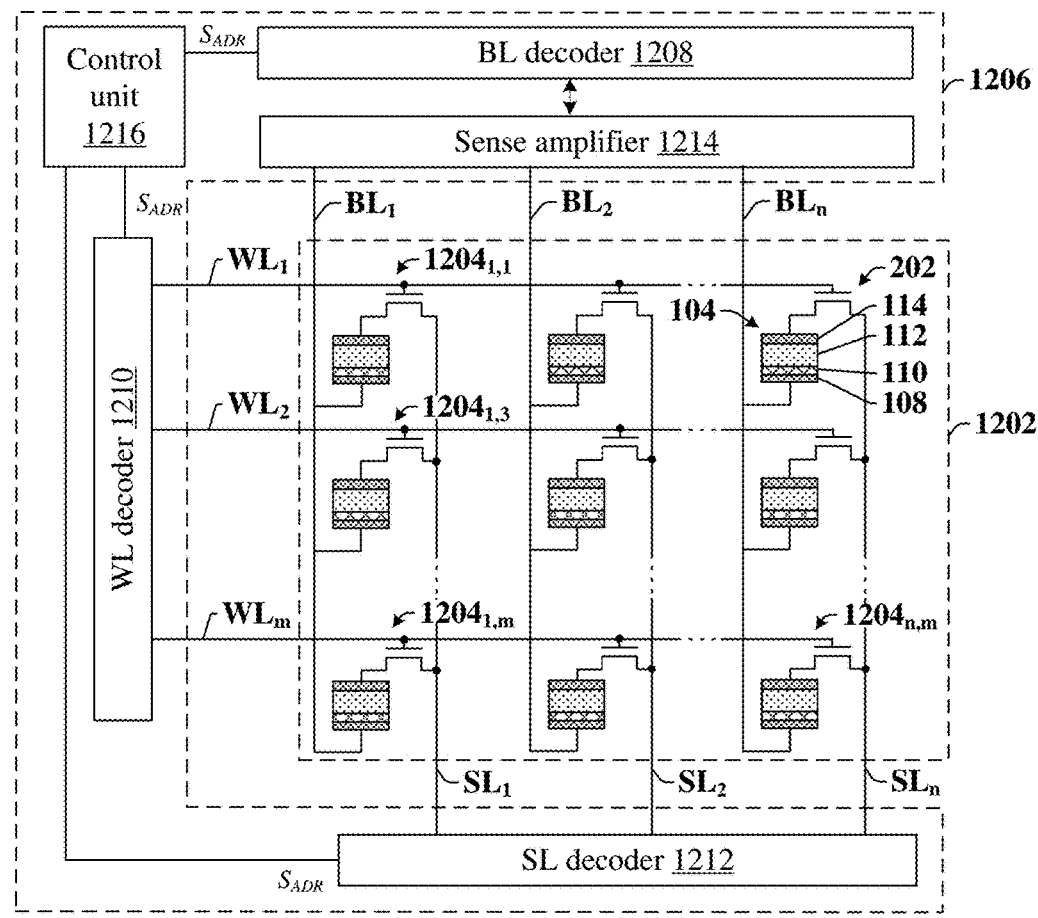
FIG. 12 illustrates an exemplary schematic diagram of a memory circuit having a memory array comprising ferroelectric memory devices respectively having a ferroelectric data storage structure that includes an amorphous initiation layer.

FIG. 12 illustrates an exemplary schematic diagram of ferroelectric memory circuit 1200 having ferroelectric memory devices respectively comprising an amorphous initiation layer.

The ferroelectric memory circuit 1200 comprises a ferroelectric memory array 1202 including a plurality of ferroelectric memory cells $1204_{1,1}$-$1204_{n,m}$. The plurality of ferroelectric memory cells $1204_{1,1}$-$1204_{n,m}$ are arranged within the ferroelectric memory array 1202 in rows and/or columns. The plurality of ferroelectric memory cells $1204_{1,x}$-$1204_{n,x}$ within a row are operably coupled to word-lines $WL_x$ (x=1-m). The plurality of ferroelectric devices $1204_{x,1}$-$1204_{x,m}$ within a column are operably coupled to bit-lines $BL_x$ (x=1-n) and source-lines $SL_x$ (x=1-n). In some embodiments, the plurality of ferroelectric memory cells $1204_{1,1}$-$1204_{n,m}$ may respectively have a cell size (e.g., width) that is less than approximately 135 nm. At this cell size, the disclosed amorphous initiation layer is configured to have a significant mitigation of performance degrading effects arising from memory cell scaling.

The word-lines $WL_1$-$WL_m$, the bit-lines $BL_1$-$BL_n$, and the source-lines $SL_1$-$SL_n$, are coupled to control circuitry 1206. In some embodiments, the control circuitry 1206 comprises a word-line decoder 1210 coupled to the word-lines $WL_1$-$WL_m$, a bit-line decoder 1208 coupled to the bit-lines $BL_1$-$BL_n$, and a source-line decoder 1212 coupled to the source-lines $SL_1$-$SL_n$. In some embodiments, the control circuitry 1206 further comprises a sense amplifier 1214 coupled to the bit-lines $BL_1$-$BL_n$ or the source-lines $SL_1$-$SL_n$. In some embodiments, the control circuitry 1206 further comprises a control unit 1216 configured to send address information $S_{ADR}$ to the word-line decoder 1210, the bit-line decoder 1208, and/or the source-line decoder 1212 to enable the control circuitry 1206 to selectively access one or more of the plurality of ferroelectric memory cells $1204_{1,1}$-$1204_{n,m}$.

For example, during operation, the control unit 1216 is configured to provide address information $S_{ADR}$ to the word-line decoder 1210, the bit-line decoder 1208, and the source-line decoder 1212. Based on the address information $S_{ADR}$, the word-line decoder 1210 is configured to selectively apply a bias voltage to one of the word-lines $WL_1$-$WL_m$. Concurrently, the bit-line decoder 1208 is configured to selectively apply a bias voltage to one of the bit-lines $BL_1$-$BL_n$ and/or the source-line decoder 1212 is configured to selectively apply a bias voltage to one of the source-lines $SL_1$-$SL_n$. By applying bias voltages to selective ones of the word-lines $WL_1$-$WL_m$, the bit-lines $BL_1$-$BL_1$, and/or the source-lines $SL_1$-$SL_n$, the ferroelectric memory circuit 1200 can be operated to write different data states to and/or read data states from the plurality of ferroelectric memory cells $1204_{1,1}$-$1204_{n,m}$.

FIGS. 13-22 illustrate cross-sectional views 1300-2200 of some embodiments of a method of forming an integrated chip having a ferroelectric data storage structure that includes an amorphous initiation layer. Although FIGS. 13-22 are described in relation to a method, it will be appreciated that the structures disclosed in FIGS. 13-22 are not limited to such a method, but instead may stand alone as structures independent of the method.

Figure 13:
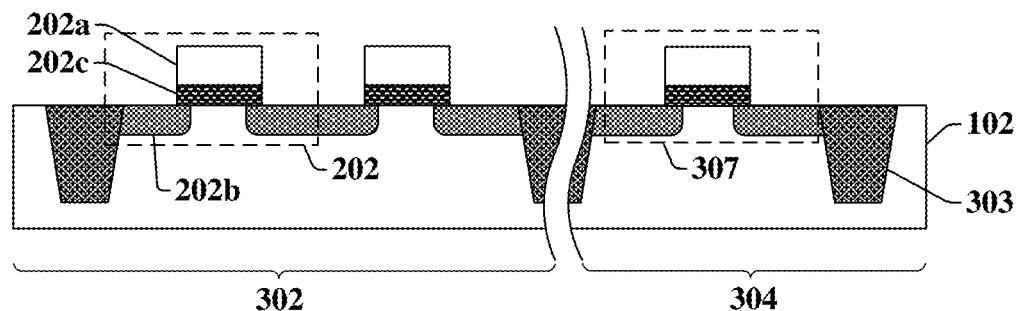
FIGS. 13-22 illustrate cross-sectional views of some embodiments of a method of forming an integrated chip having a ferroelectric data storage structure that includes an amorphous initiation layer.

As shown in cross-sectional view 1300 of FIG. 13, a substrate 102 is provided. In various embodiments, the substrate 102 may be any type of semiconductor body (e.g., silicon, SiGe, SOI, etc.), such as a semiconductor wafer and/or one or more die on a wafer, as well as any other type of semiconductor and/or epitaxial layers, associated therewith. In some embodiments, the substrate 102 may comprise a memory region 302 and a logic region 304. In some embodiments, an access device 202 is formed on and/or within the substrate 102 within the memory region 302. In some embodiments, a logic device 307 is formed on and/or within the substrate 102 within the logic region 304. In some embodiments, the access device 202 and/or the logic device 307 may comprise a transistor. In some such embodiments, the access device 202 and/or the logic device 307 may be formed by depositing a gate dielectric film and a gate electrode film over the substrate 102. The gate dielectric film and the gate electrode film are subsequently patterned to form a gate dielectric (e.g., 202c) and a gate electrode (e.g., 202a). The substrate 102 may be subsequently implanted to form source/drain regions (e.g., 202b) on opposing sides of the gate electrode (e.g., 202a). In some embodiments, one or more isolation structures 303 may be formed within the substrate 102 along opposing sides of the access device 202 and/or the logic device 307.

Figure 14:
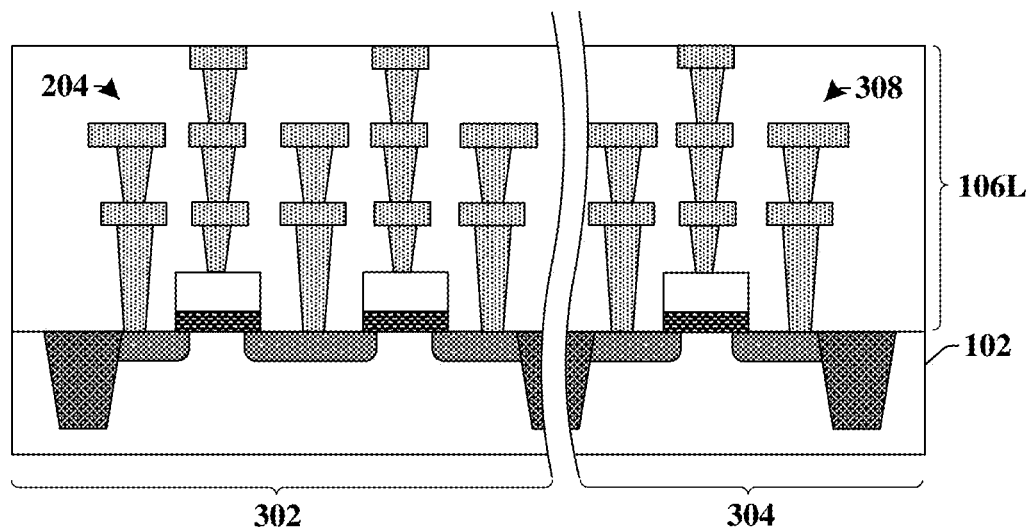

As shown in cross-sectional view 1400 of FIG. 14, one or more lower ILD layers 106L are formed over the substrate 102. In some embodiments, one or more lower interconnects 204 are formed within the one or more lower ILD layers 106L within the memory region 302 and one or more additional lower interconnects 308 are formed within the one or more lower ILD layers 106L within the logic region 304. In some embodiments, the one or more lower interconnects 204 and/or the one or more additional lower interconnects 308 may comprise a conductive contact, an interconnect wire, and/or an interconnect via. In some embodiments, the one or more lower ILD layers 106L may comprise one or more stacked inter-level dielectric (ILD) layers. The one or more lower interconnects 204 and/or the one or more additional lower interconnects 308 may be formed by forming a lower ILD layer (e.g., an oxide, a low-k dielectric, or an ultra low-k dielectric) over the substrate 102, selectively etching the lower ILD layer to form a via hole and/or a trench within the lower ILD layer, forming a conductive material (e.g., copper, aluminum, etc.) within the via hole and/or the trench, and performing a planarization process (e.g., a chemical mechanical planarization process) to remove excess of the conductive material from over the lower ILD layer.

Figure 15:
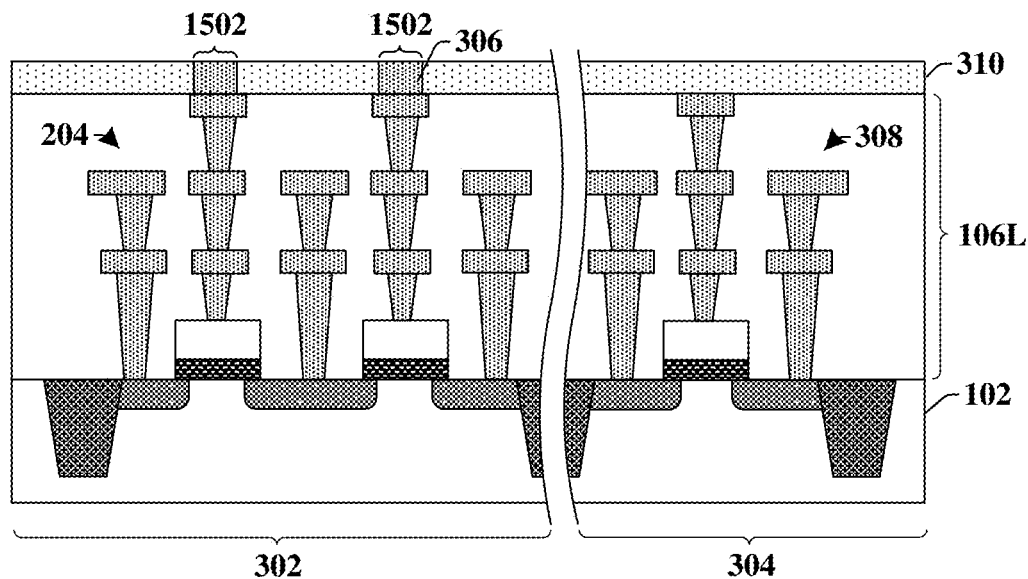

As shown in cross-sectional view 1500 of FIG. 15, a lower insulating structure 310 is formed over the one or more lower interconnects 204 and/or the one or more lower ILD layers 106L. In some embodiments, the lower insulating structure 310 comprises one or more of silicon rich oxide, silicon carbide, silicon nitride, and/or the like. In some embodiments, the lower insulating structure 310 may be formed by one or more deposition processes (e.g., a physical vapor deposition (PVD) process, a chemical vapor deposition (CVD) process, a plasma enhanced CVD (PE-CVD) process, or the like).

In some embodiments, the lower insulating structure 310 may be selectively etched to form an opening 1502 that extends through the lower insulating structure 310 to expose an upper surface of the one or more lower interconnects 204. In some embodiments, the opening 1502 may be subsequently filled with a conductive material to form a lower electrode via 306 that extends through the lower insulating structure 310. In some embodiments, the lower electrode via 306 may comprise a metal, a metal nitride, and/or the like. For example, the lower electrode via 306 may comprise tungsten, tantalum nitride, titanium nitride, ruthenium, platinum, iridium, or the like. In some embodiments, the conductive material may be formed by a deposition process (e.g., a PVD process, a CVD process, a PE-CVD process, or the like). In some embodiments, a planarization process (e.g., a chemical mechanical planarization (CMP) process) may be performed to remove excess of the conductive from over the lower insulating structure 310.

Figure 16:
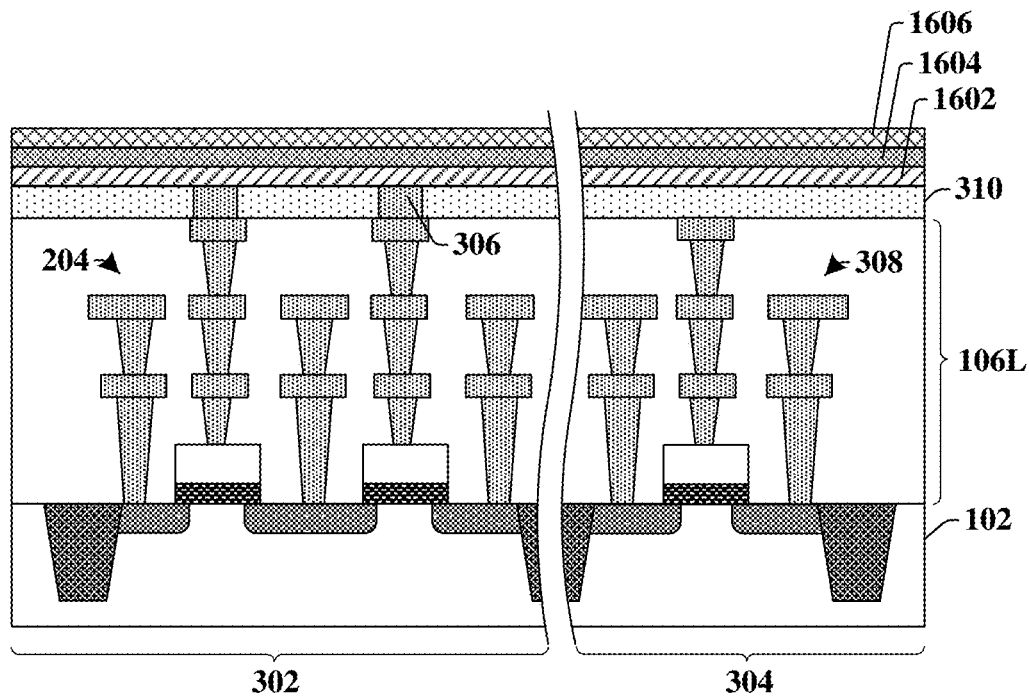

As shown in cross-sectional view 1600 of FIG. 16, a diffusion barrier layer 1602 is formed over the lower insulating structure 310. In some embodiments, the diffusion barrier layer 1602 may comprise a metal nitride, such as titanium nitride, tantalum nitride, or the like. A lower electrode layer 1604 is formed over the diffusion barrier layer 1602. In some embodiments, the lower electrode layer 1604 may comprise tungsten, tantalum, tantalum nitride, titanium, titanium nitride, ruthenium, platinum, iridium, or the like. In some embodiments, the diffusion barrier layer 1602 and the lower electrode layer 1604 may be formed by deposition processes (e.g., a PVD process, a CVD process, a PE-CVD process, or the like). In other embodiments (not shown), the diffusion barrier layer 1602 may be formed within the opening in the lower insulating structure 310 prior to depositing the conductive material within the opening (e.g., 1502 of FIG. 15) to form the lower electrode via 306.

An un-patterned amorphous initiation layer 1606 is formed over the lower electrode layer 1604. In various embodiments, the un-patterned amorphous initiation layer 1606 may comprise zirconium oxide (e.g., $ZrO_x$), hafnium oxide (e.g., $HfO_x$), silicon oxide (e.g., $SiO_x$), tantalum oxide (e.g., $TaO_x$), aluminum oxide (e.g., $AlO_x$), titanium oxide (e.g., $TiO_x$), yttrium oxide (e.g., $YO_x$), gadolinium oxide (e.g., $GdO_x$), lanthanum oxide (e.g., $LaO_x$), strontium oxide (e.g., $SrO_x$), and/or the like. In some embodiments, the un-patterned amorphous initiation layer 1606 may be formed by an atomic layer deposition (ALD) process. In other embodiments, the un-patterned amorphous initiation layer 1606 may be formed by a high temperature oxidation process in a furnace. In some embodiments, the un-patterned amorphous initiation layer 1606 may be formed to have an amorphous phase.

In some embodiments, the un-patterned amorphous initiation layer 1606 may comprise and/or be a material having a relatively high crystallization temperature. The relatively high crystallization temperature allows for the un-patterned amorphous initiation layer 1606 to remain amorphous during subsequent high temperature processes. By having the un-patterned amorphous initiation layer 1606 remain amorphous during high temperature processes, the un-patterned amorphous initiation layer 1606 is able to influence a phase of a subsequently formed intermediate ferroelectric material layer (e.g., 1702 of FIG. 17). In some embodiments, the un-patterned amorphous initiation layer 1606 may comprise a first material having a first crystallization temperature that is higher than a second crystallization temperature of a second material of a subsequently formed intermediate ferroelectric material layer (e.g., 1702 of FIG. 17), so that the amorphous initiation layer 110 remains amorphous even while the subsequently formed intermediate ferroelectric material layer changes to a crystalline phase (e.g., an orthorhombic crystalline phase). In some embodiments, the un-patterned amorphous initiation layer 1606 may comprise and/or be a material having a crystallization temperature that is greater than approximately 400° C., greater than approximately 500° C., greater than approximately 750° C., or other similar values.

Figure 17:
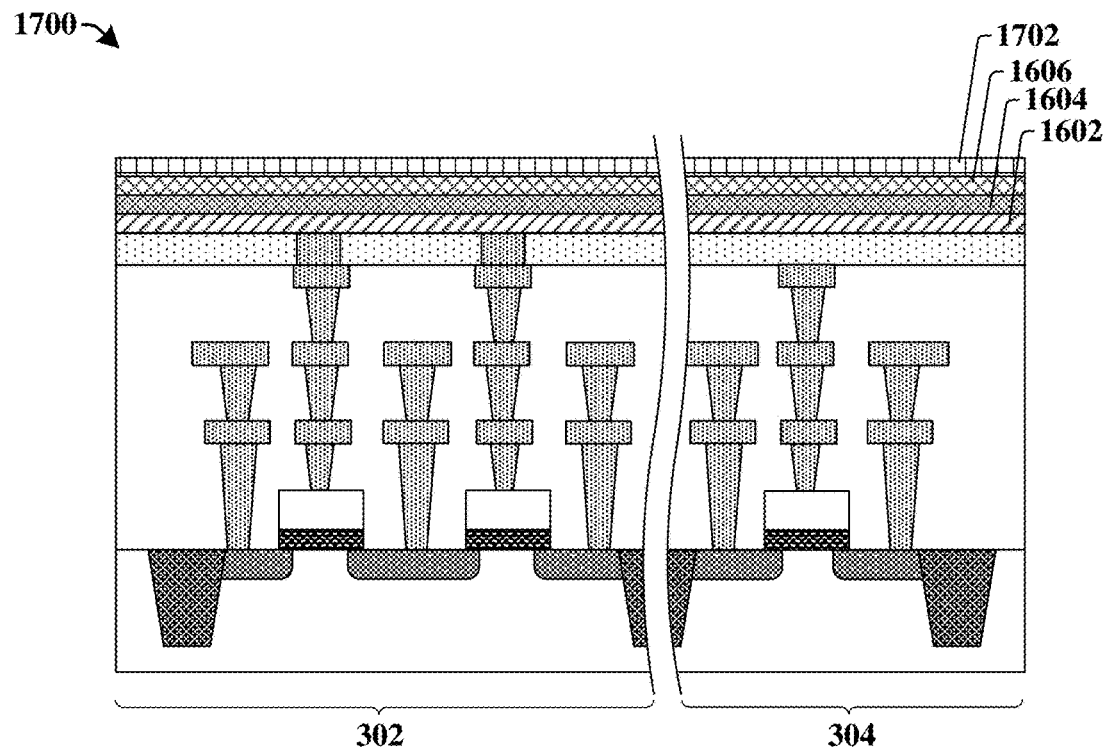

As shown in cross-sectional view 1700 of FIG. 17, an intermediate ferroelectric material layer 1702 is formed onto the un-patterned amorphous initiation layer 1606. In some embodiments, the intermediate ferroelectric material layer 1702 may be formed to have a substantially uniform amorphous phase. In some embodiments, the intermediate ferroelectric material layer 1702 may comprise hafnium oxide, hafnium zirconium oxide (HZO), lead zirconate titanate (PZT), or the like. In some embodiments, the intermediate ferroelectric material layer 1702 may be formed by an atomic layer deposition (ALD) process. In other embodiments, the intermediate ferroelectric material layer 1702 may be formed by a PVD process, a CVD process, a PE-CVD process, or the like.

In some additional embodiments, one or more additional un-patterned amorphous initiation layers and/or one or more intermediate ferroelectric material layers may be formed over the lower electrode layer 1604. The one or more additional un-patterned amorphous initiation layers and/or one or more intermediate ferroelectric material layers may correspond to the embodiments shown in FIGS. 5-8. For example, in some embodiments, a second un-patterned amorphous initiation layer (e.g., corresponding to second amorphous initiation layer 502 of FIG. 5) may be formed onto the intermediate ferroelectric material layer. In some additional embodiments, a second intermediate ferroelectric material layer (e.g., corresponding to second ferroelectric switching layer 602 of FIG. 6) may be formed onto the second amorphous initiation layer. In yet additional embodiments, a third amorphous initiation layer (e.g., corresponding to third amorphous initiation layer 702 of FIG. 7) may be formed onto the second intermediate ferroelectric material layer.

Figure 18:
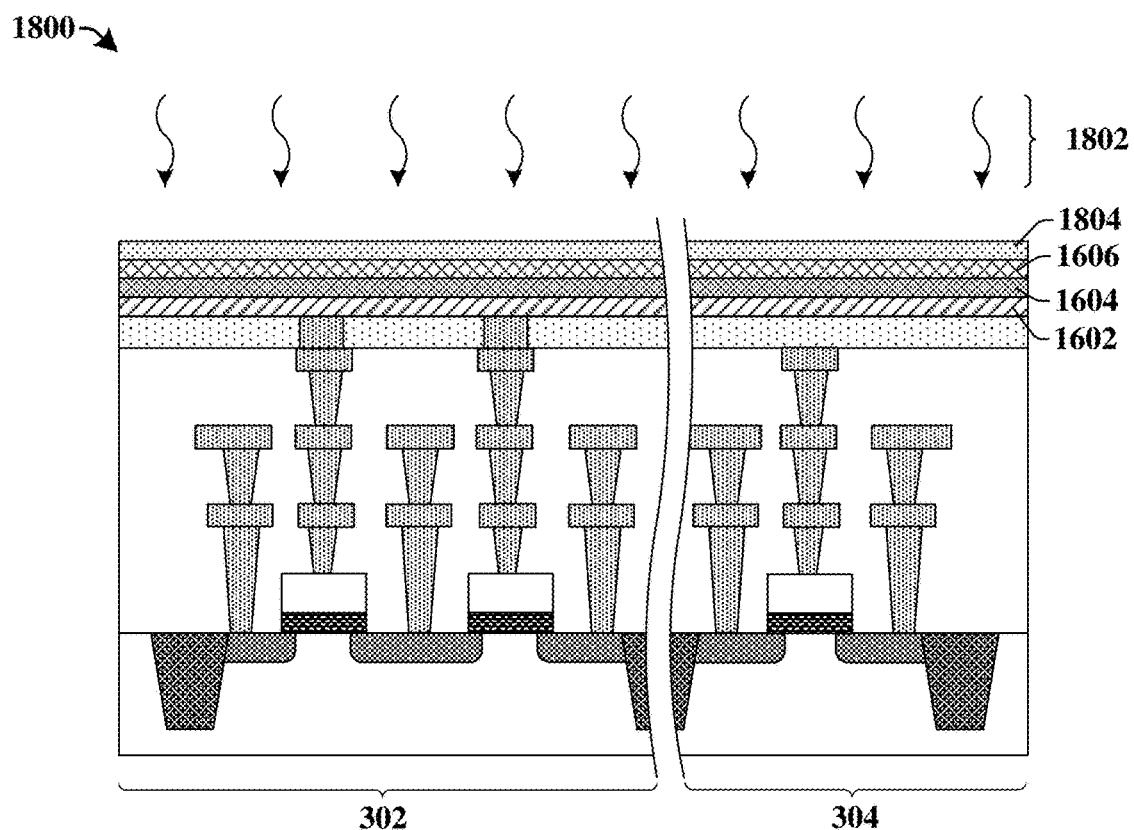

As shown in cross-sectional view 1800 of FIG. 18, an anneal process 1802 may be performed after deposition of the intermediate ferroelectric material layer (1702 of FIG. 18). The anneal process 1802 changes a phase of the intermediate ferroelectric material layer (1702 of FIG. 18) to form a ferroelectric material layer 1804. For example, the anneal process 1802 may change an amorphous phase of the intermediate ferroelectric material layer to a ferroelectric material layer 1804 having a substantially uniform orthorhombic crystalline phase, so that the ferroelectric material layer 1804 has a predominately orthorhombic crystalline phase. In some embodiments, the anneal process 1802 may be performed at a temperature that is in a range of between approximately 200 degrees ° C. and approximately 700° C., between approximately 200° C. and approximately 500° C., between approximately 250° C. and approximately 400° C., between approximately 300° C. and approximately 400° C., or other similar values.

Figure 19:
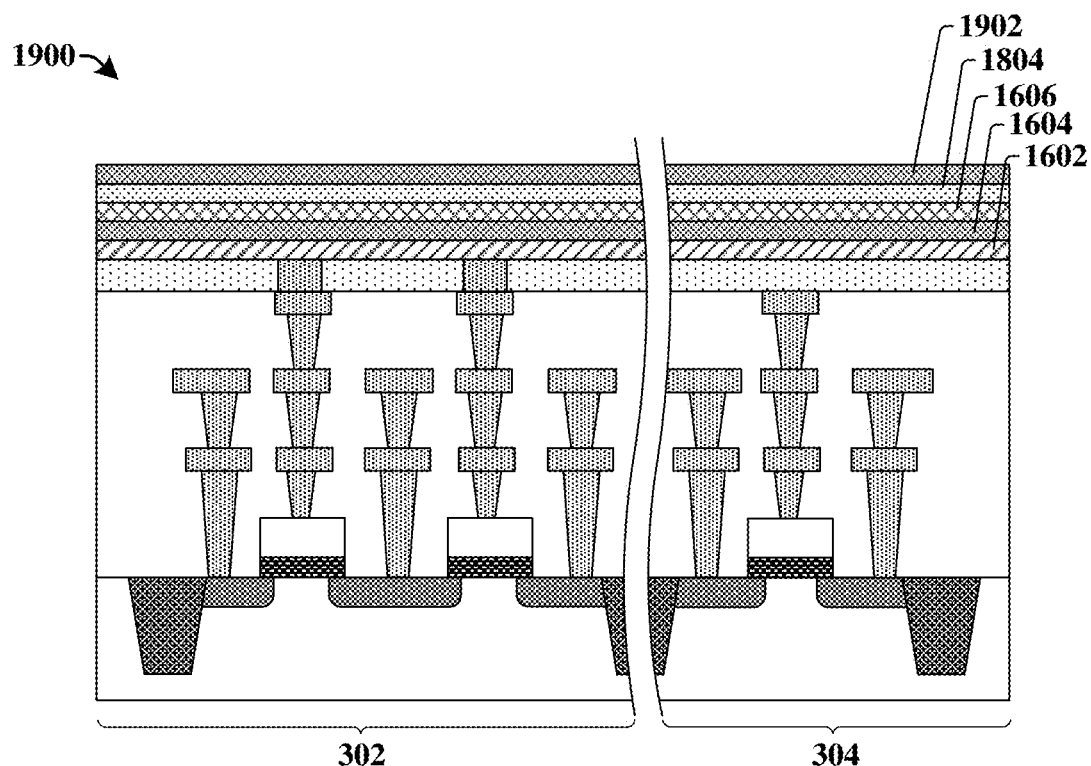

As shown in cross-sectional view 1900 of FIG. 19, an upper electrode layer 1902 is formed over the ferroelectric material layer 1804. The upper electrode layer 1902 may comprise a metal, a metal nitride, or the like. In some embodiments, the upper electrode layer 1902 may comprise tungsten, tantalum, tantalum nitride, titanium, titanium nitride, ruthenium, platinum, iridium, or the like. In some embodiments, the upper electrode layer 1902 may be formed by a deposition process (e.g., a PVD process, a CVD process, a PE-CVD process, or the like). In some alternative embodiments, the anneal process may be performed after deposition of the upper electrode layer 1902.

Figure 20:
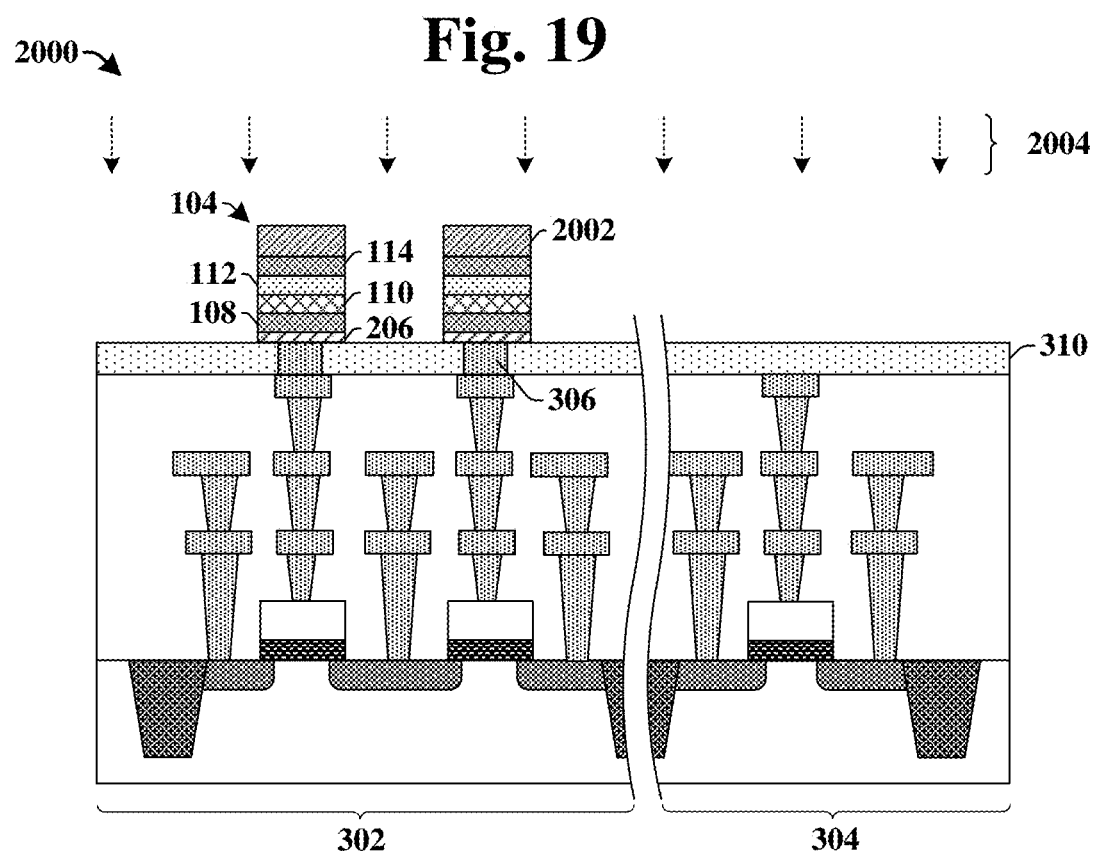

As shown in cross-sectional view 2000 of FIG. 20, one or more patterning processes 2002 are performed on the upper electrode layer (1902 of FIG. 19), the ferroelectric material layer (1804 of FIG. 19), the un-patterned amorphous initiation layer (1606 of FIG. 19), the lower electrode layer (1604 of FIG. 19), and diffusion barrier layer (1602 of FIG. 19) to form a ferroelectric memory device 104 having a ferroelectric switching layer 112 and an amorphous initiation layer 110 disposed between a lower electrode 108 and an upper electrode 114. The one or more patterning processes 2002 remove a part of the upper electrode layer (1902 of FIG. 19) to form the upper electrode 114, remove a part of the ferroelectric material layer (1804 of FIG. 19) to form a ferroelectric switching layer 112, remove a part of the un-patterned amorphous initiation layer (1606 of FIG. 19) to form an amorphous initiation layer 110, remove a part of the lower electrode layer (1604 of FIG. 19) to form a lower electrode 108, and remove a part of the diffusion barrier layer (1602 of FIG. 19) to form a diffusion barrier 206.

In some embodiments, the one or more patterning processes 2002 may comprise a patterning process configured to selectively expose the upper electrode layer (1902 of FIG. 19) to an etchant according to a masking layer. In various embodiments, the masking layer 2004 may comprise a metal (e.g., titanium, titanium nitride, tantalum, or the like), a dielectric material (e.g., silicon-nitride, silicon-carbide, or the like), a photosensitive material (e.g., photoresist), or the like. In some additional embodiments, the one or more patterning processes 2002 may comprise a first patterning process configured to selectively exposes the upper electrode layer (1902 of FIG. 19) to a first etchant according to the masking layer to form the upper electrode 114. In some embodiments, one or more sidewall spacers may be formed along opposing sides of the upper electrode 114 and the masking layer after the first patterning process is completed. In some embodiments, the one or more patterning processes 2002 may further comprise a second patterning process performed after forming the one or more sidewall spacers. The second patterning process is configured to selectively expose the ferroelectric material layer (1804 of FIG. 19), the un-patterned amorphous initiation layer (1606 of FIG. 19), and the lower electrode layer (1604 of FIG. 19), and the diffusion barrier layer (1602 of FIG. 19) to a second etchant in areas that are not covered by the masking layer and the one or more sidewall spacers.

Figure 21:
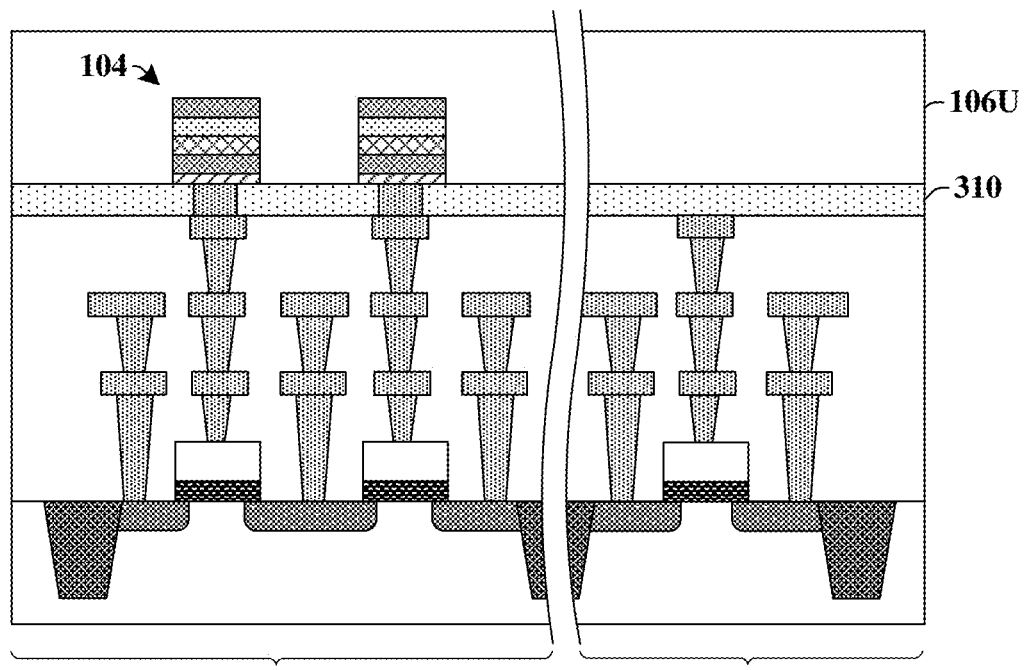

As shown in cross-sectional view 2100 of FIG. 21, an upper ILD layer 106U is formed over the ferroelectric memory device 104. In some embodiments, the upper ILD layer 106U may be formed by a deposition process (e.g., PVD, CVD, PE-CVD, ALD, or the like). In various embodiments, the upper ILD layer 106U may comprise one or more of silicon dioxide, carbon doped silicon dioxide, silicon oxynitride, borosilicate glass (BSG), phosphorus silicate glass (PSG), borophosphosilicate (BPSG), fluorosilicate glass (FSG), undoped silicate glass (USG), a porous dielectric material, or the like.

Figure 22:
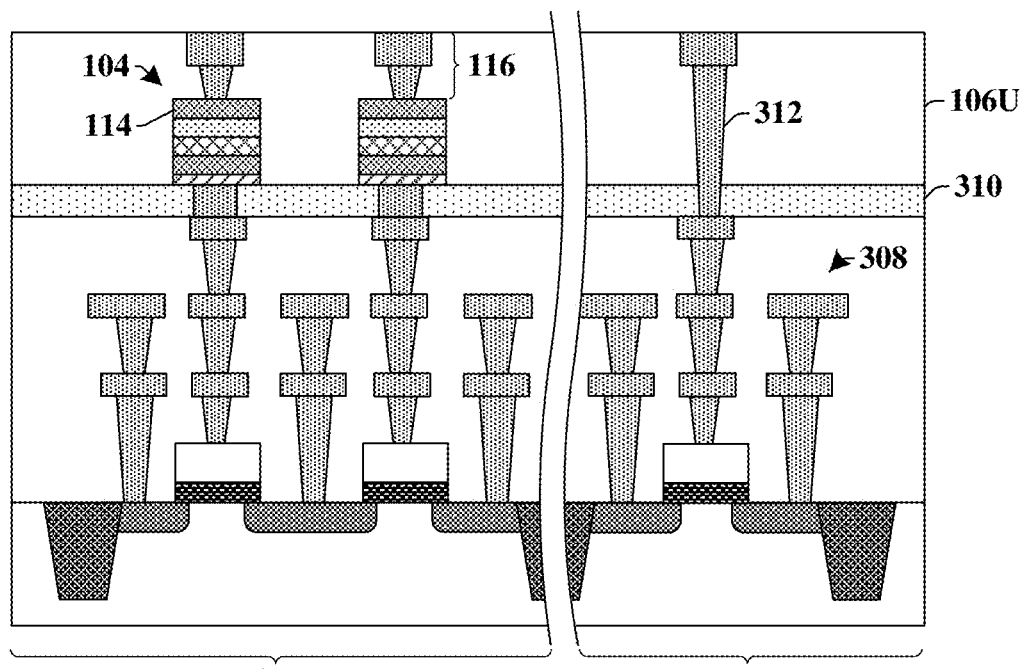

As shown in cross-sectional view 2200 of FIG. 22, an upper interconnect 116 is formed on the upper electrode 114. The upper interconnect 116 extends through the upper ILD layer 106U to the upper electrode 114. In some embodiments, the upper interconnect 116 may be formed by selectively etching the upper ILD layer 106U to form an opening that extends from a top surface of the upper ILD layer 106U to expose an upper surface of the upper electrode 114. In some embodiments, the opening may be formed by a third patterning process that uses a third etchant to selectively etch the upper ILD layer 106U according to a masking layer (e.g., photoresist). A conductive material (e.g., copper, aluminum, etc.) is formed within the opening. In some embodiments, after forming the conductive material within the opening a planarization process (e.g., a CMP process) is performed to remove excess of the conductive material from over a top of the upper ILD layer 106U. In some embodiments, an interconnect via 312 may also be formed within the logic region 304. The interconnect via 312 is formed to extend from the top surface of the upper ILD layer 106U to the one or more additional lower interconnects 308.

FIGS. 23-32 illustrate cross-sectional views 2300-3200 of some alternative embodiments of a method of forming an integrated chip having a ferroelectric data storage structure that includes an amorphous initiation layer. Although FIGS. 23-32 are described in relation to a method, it will be appreciated that the structures disclosed in FIGS. 23-32 are not limited to such a method, but instead may stand alone as structures independent of the method.

Figure 23:
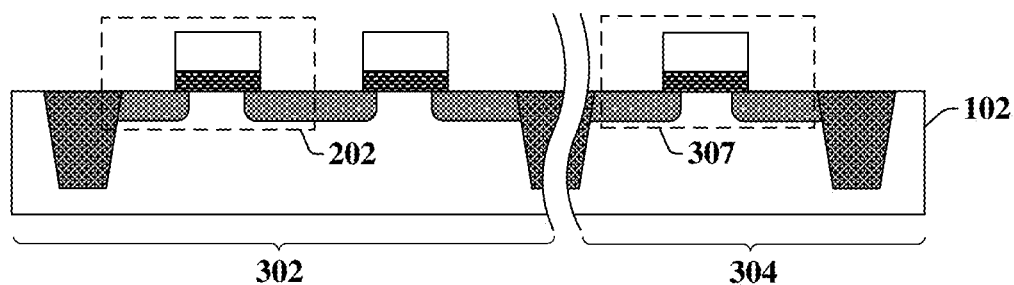
FIGS. 23-32 illustrate cross-sectional views of some additional embodiments of a method of forming an integrated chip having a ferroelectric data storage structure that includes an amorphous initiation layer.

As shown in cross-sectional view 2300 of FIG. 23, a substrate 102 is provided. In some embodiments, the substrate 102 may comprise a memory region 302 and a logic region 304. In some embodiments, an access device 202 is formed on and/or within the substrate 102 within the memory region 302. In some additional embodiments, a logic device 307 is formed on and/or within the substrate 102 within the logic region 304. In some embodiments, the access device 202 and/or the logic device 307 may be formed as described in relation to FIG. 13.

Figure 24:
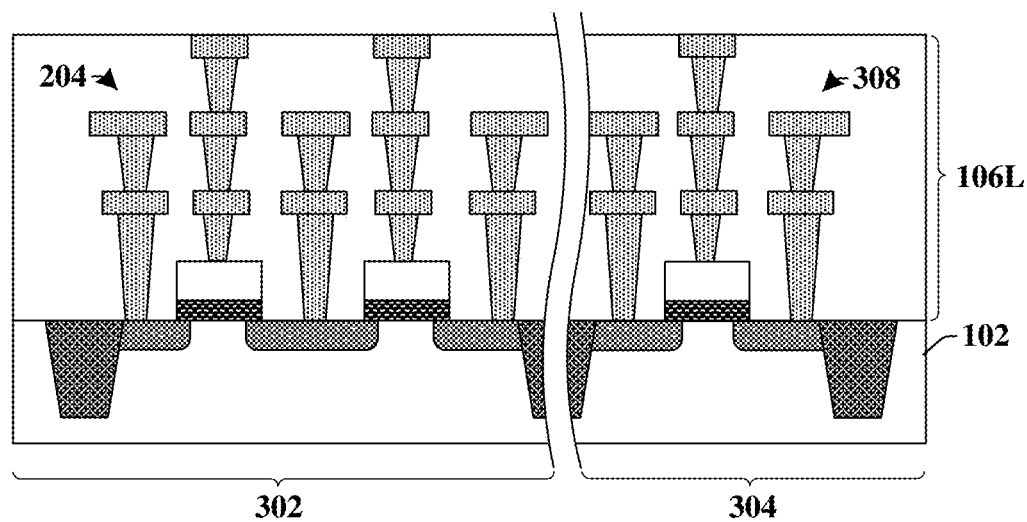

As shown in cross-sectional view 2400 of FIG. 24, one or more lower ILD layers 106L are formed over the substrate 102. In some embodiments, one or more lower interconnects 204 are formed within the one or more lower ILD layers 106L within the memory region 302 and one or more additional lower interconnects 308 are formed within the one or more lower ILD layers 106L within the logic region 304. In some embodiments, the one or more lower interconnects 204 and/or the one or more additional lower interconnects 308 may be formed as described in relation to FIG. 14.

Figure 25:
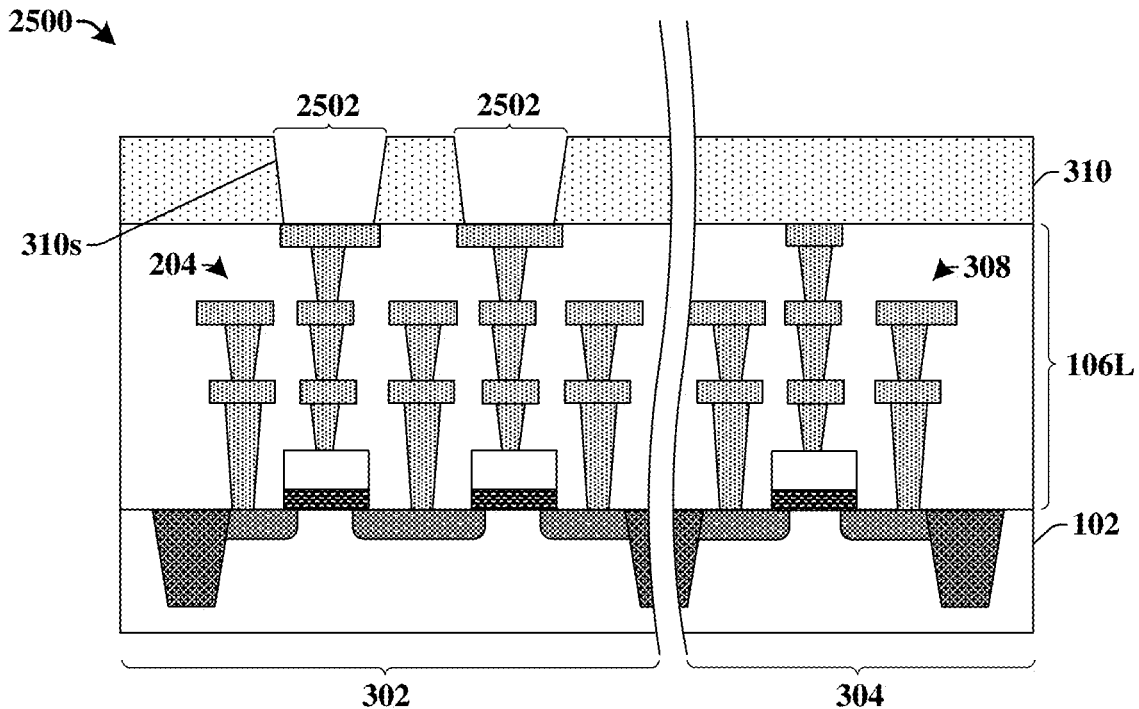

As shown in cross-sectional view 2500 of FIG. 25, a lower insulating structure 310 is formed over the one or more lower ILD layers 106L and/or the one or more lower interconnects 204. In some embodiments, the lower insulating structure 310 may be selectively etched to form one or more sidewalls 310s of the lower insulating structure 310 that define an opening 2502 that extends through the lower insulating structure 310 to expose an upper surface of the one or more lower interconnects 204.

Figure 26:
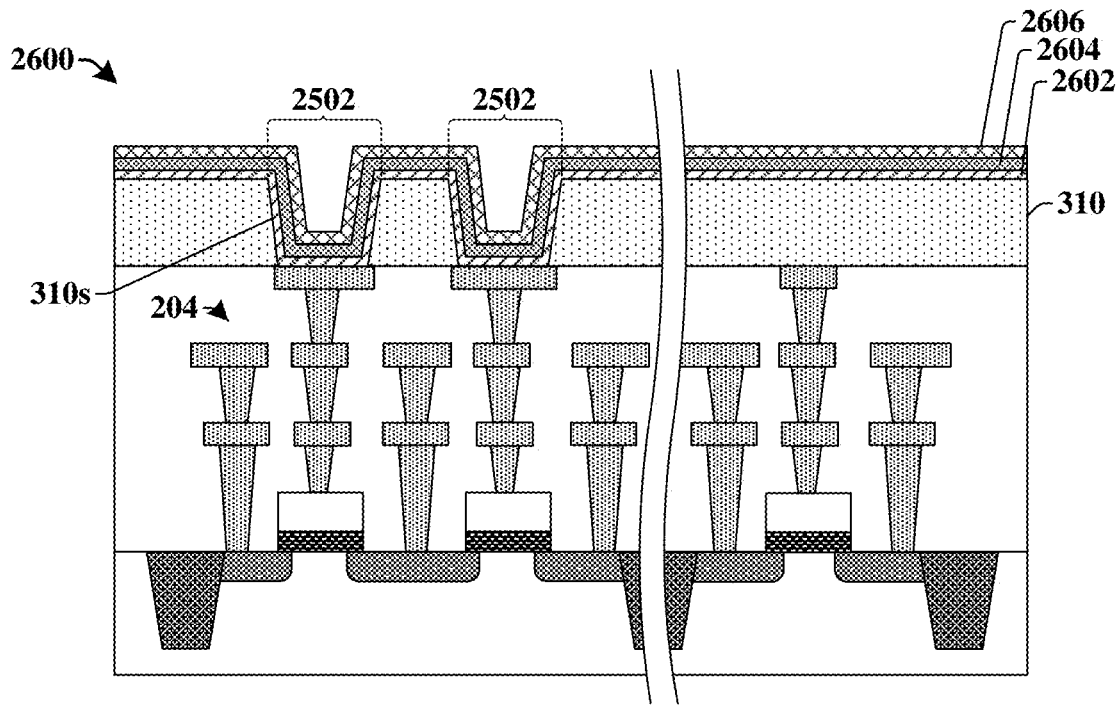

As shown in cross-sectional view 2600 of FIG. 26, a diffusion barrier layer 2602 is formed over the lower insulating structure 310. The diffusion barrier layer 2602 extends from over the lower insulating structure 310 to within the opening 2502 and along the one or more sidewalls 310s of the lower insulating structure 310. The diffusion barrier layer 2602 is formed to have angled interior sidewalls that define a first recess within the upper surface of the diffusion barrier layer 2602. A lower electrode layer 2604 is formed over the diffusion barrier layer 2602. The lower electrode layer 2604 extends from over the diffusion barrier layer 2602 to within the opening 2502 and along the angled interior sidewalls of the diffusion barrier layer 2602. The lower electrode layer 2604 is formed to have angled interior sidewalls that define a second recess within the upper surface of the diffusion barrier layer 2602. An un-patterned amorphous initiation layer 2606 is formed over the lower electrode layer 2604. The un-patterned amorphous initiation layer 2606 extends from over the lower electrode layer 2604 to within the opening 2502 and along the angled interior sidewalls of the lower electrode layer 2604. The un-patterned amorphous initiation layer 2606 is formed to have angled interior sidewalls that define a third recess within the upper surface of the un-patterned amorphous initiation layer 2606.

Figure 27:
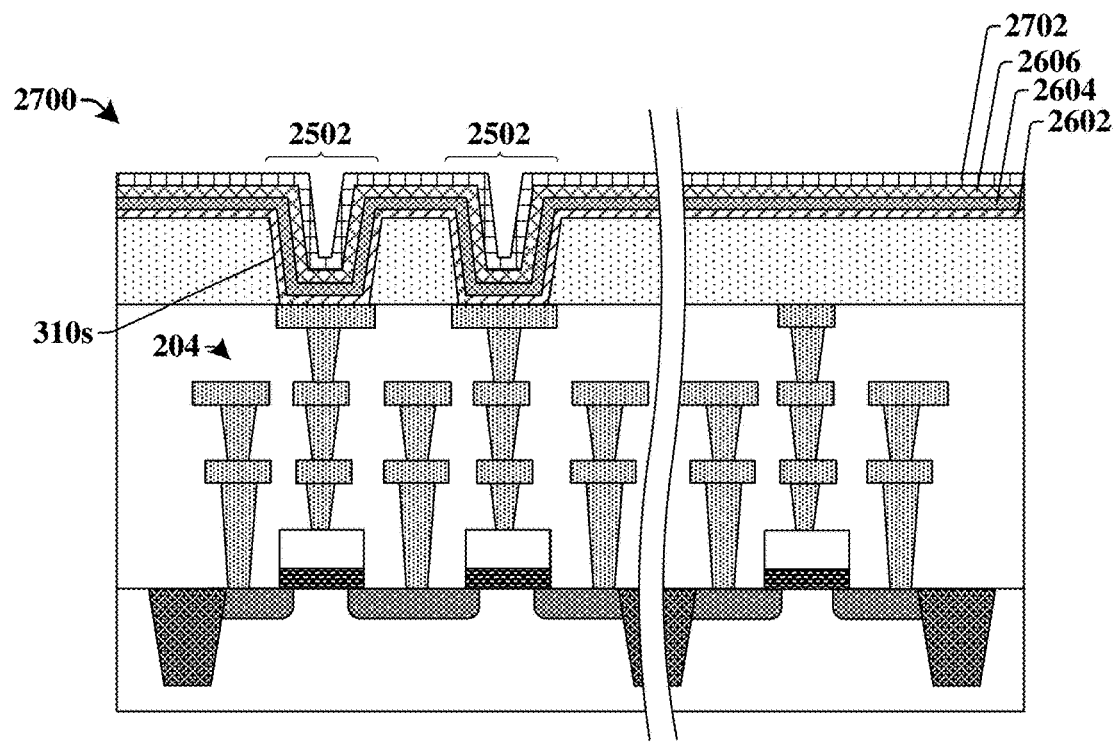

As shown in cross-sectional view 2700 of FIG. 27, an intermediate ferroelectric material layer 2702 is formed over the un-patterned amorphous initiation layer 2606. In some embodiments, the intermediate ferroelectric material layer 1702 may be formed to have a substantially uniform amorphous phase. The intermediate ferroelectric material layer 2702 extends from over the un-patterned amorphous initiation layer 2606 to within the opening 2502 and along the angled interior sidewalls of the un-patterned amorphous initiation layer 2606. The intermediate ferroelectric material layer 2702 is formed to have angled interior sidewalls that define a fourth recess within the upper surface of the intermediate ferroelectric material layer 2702.

Figure 28:
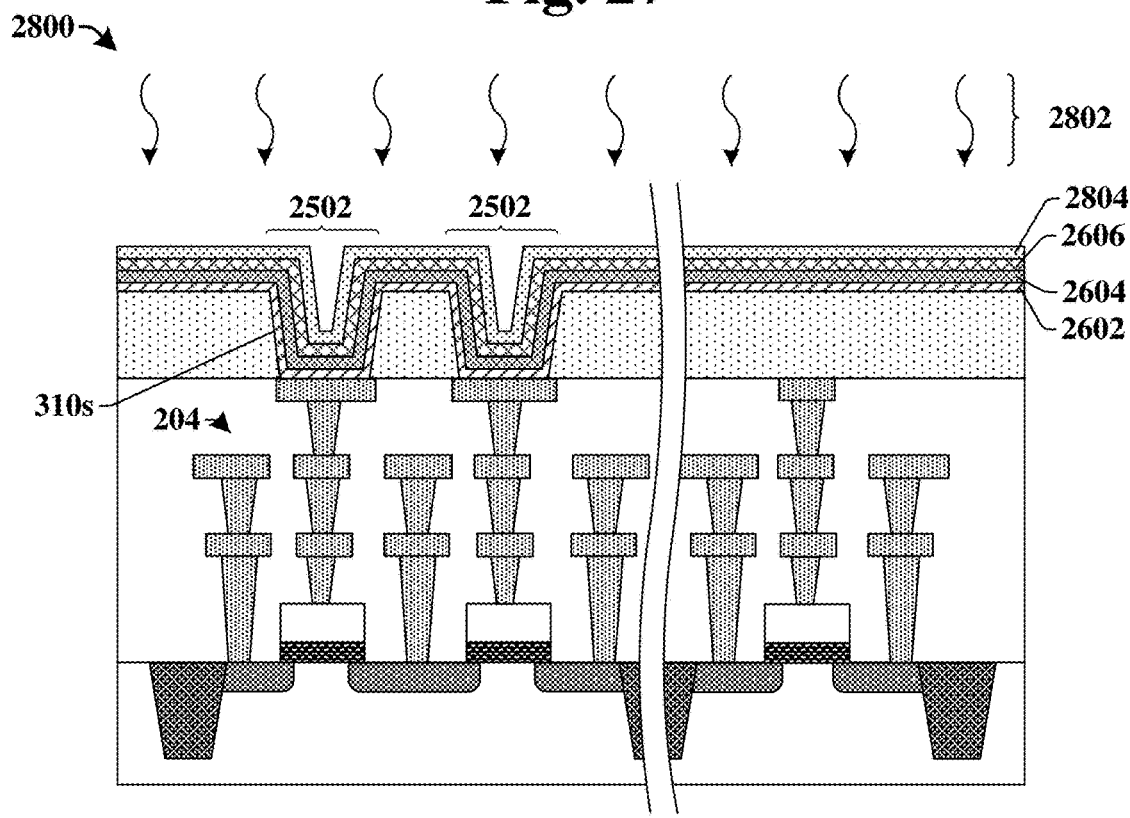

As shown in cross-sectional view 2800 of FIG. 28, an anneal process 2802 may be performed after deposition of the intermediate ferroelectric material layer (2702 of FIG. 18). The anneal process 2802 changes a phase of the intermediate ferroelectric material layer (2702 of FIG. 18). For example, the anneal process 2802 may change an amorphous phase of the intermediate ferroelectric material layer to a ferroelectric material layer 2804 having a substantially uniform orthorhombic crystalline phase. In some embodiments, the anneal process 2802 may be performed at a temperature that is in a range of between approximately 200° C. and approximately 700° C., between approximately 200° C. and approximately 500° C., between approximately 250° C. and approximately 400° C., between approximately 300° C. and approximately 400° C., or other similar values.

Figure 29:
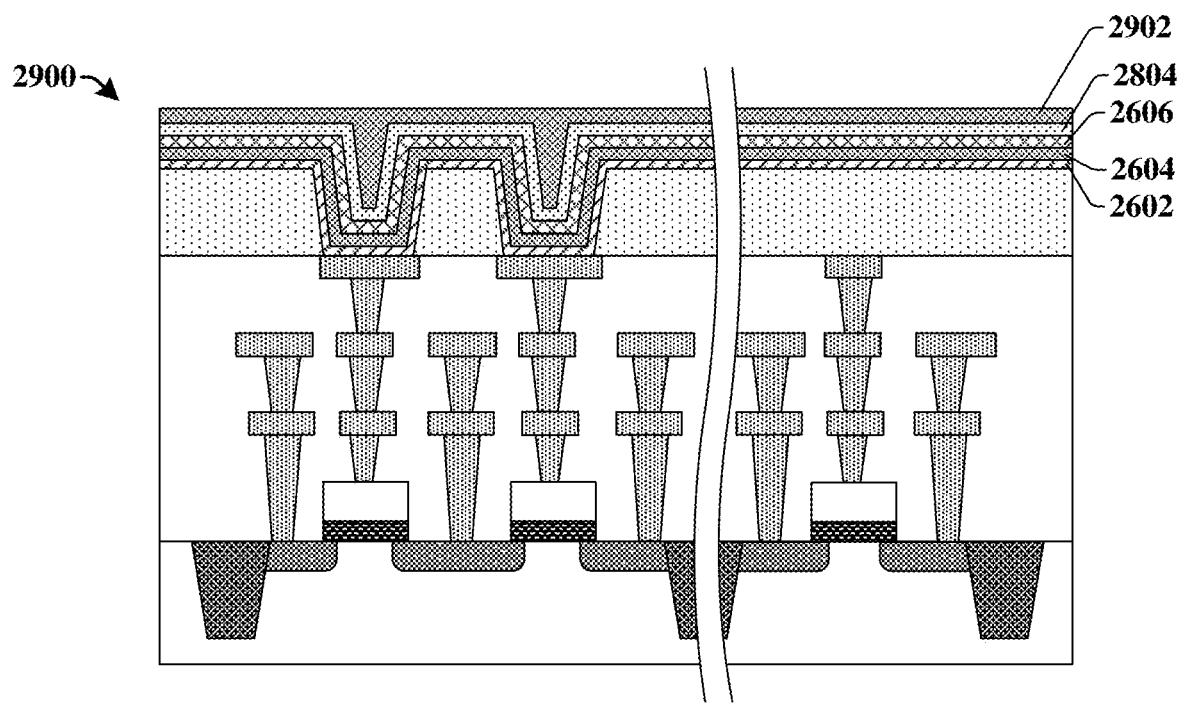

As shown in cross-sectional view 2900 of FIG. 29, an upper electrode layer 2902 is formed over the ferroelectric material layer 2804. The upper electrode layer 2902 extends from over the ferroelectric material layer 2804 to within the fourth recess and along the interior sidewalls of the ferroelectric material layer 2804.

Figure 30:
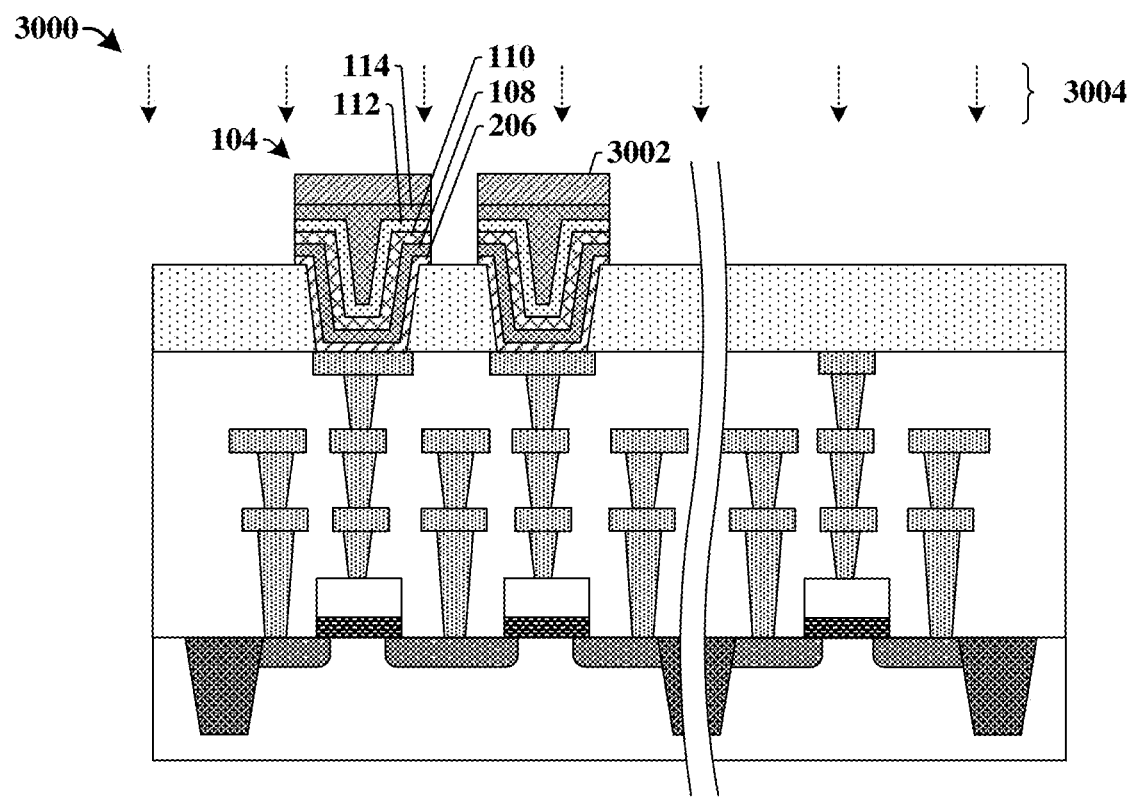

As shown in cross-sectional view 3000 of FIG. 30, one or more patterning processes 3004 are performed on the upper electrode layer (2902 of FIG. 29), the ferroelectric material layer (2804 of FIG. 29), the un-patterned amorphous initiation layer (2606 of FIG. 29), the lower electrode layer (2604 of FIG. 29), and diffusion barrier layer (2602 of FIG. 29) according to a masking layer 3002. The one or more patterning processes 3004 form a ferroelectric memory device 104 having a ferroelectric switching layer 112 and an amorphous initiation layer 110 disposed between a lower electrode 108 and an upper electrode 114. The one or more patterning processes 3004 remove a part of the upper electrode layer (2902 of FIG. 29) to form the upper electrode 114, remove a part of the ferroelectric material layer (2804 of FIG. 29) to form a ferroelectric switching layer 112, remove a part of the un-patterned amorphous initiation layer (2606 of FIG. 29) to form an amorphous initiation layer 110, remove a part of the lower electrode layer (2604 of FIG. 29) to form a lower electrode 108, and remove a part of the diffusion barrier layer (2602 of FIG. 29) to form a diffusion barrier 206.

Figure 31:
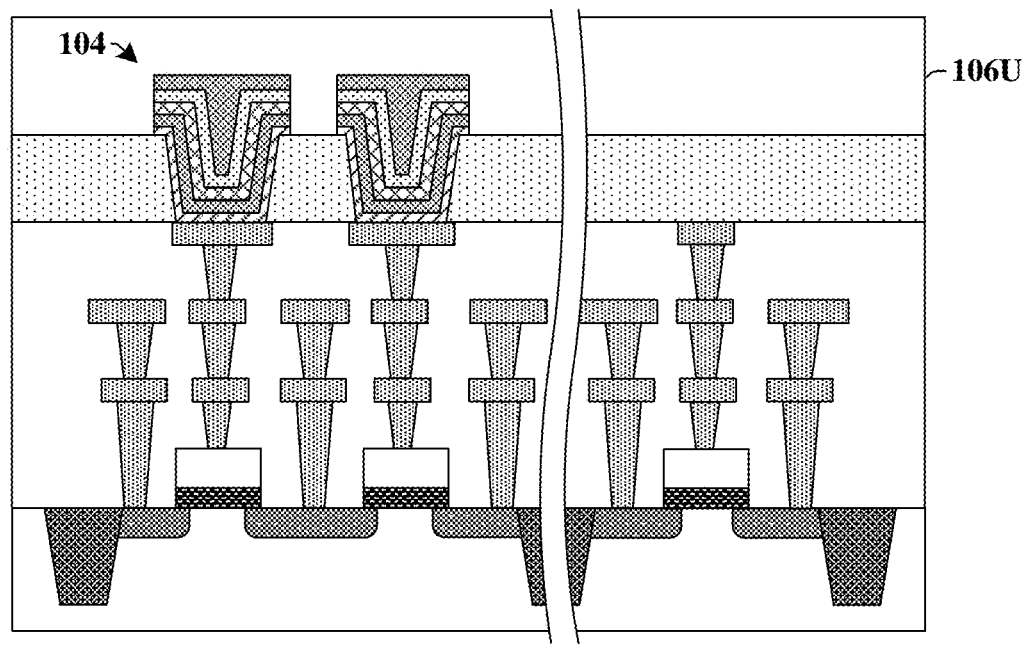

As shown in cross-sectional view 3100 of FIG. 31, an upper ILD layer 106U is formed over the ferroelectric memory device 104. In some embodiments, the upper ILD layer 106U may be formed as described in relation to FIG. 21.

Figure 32:
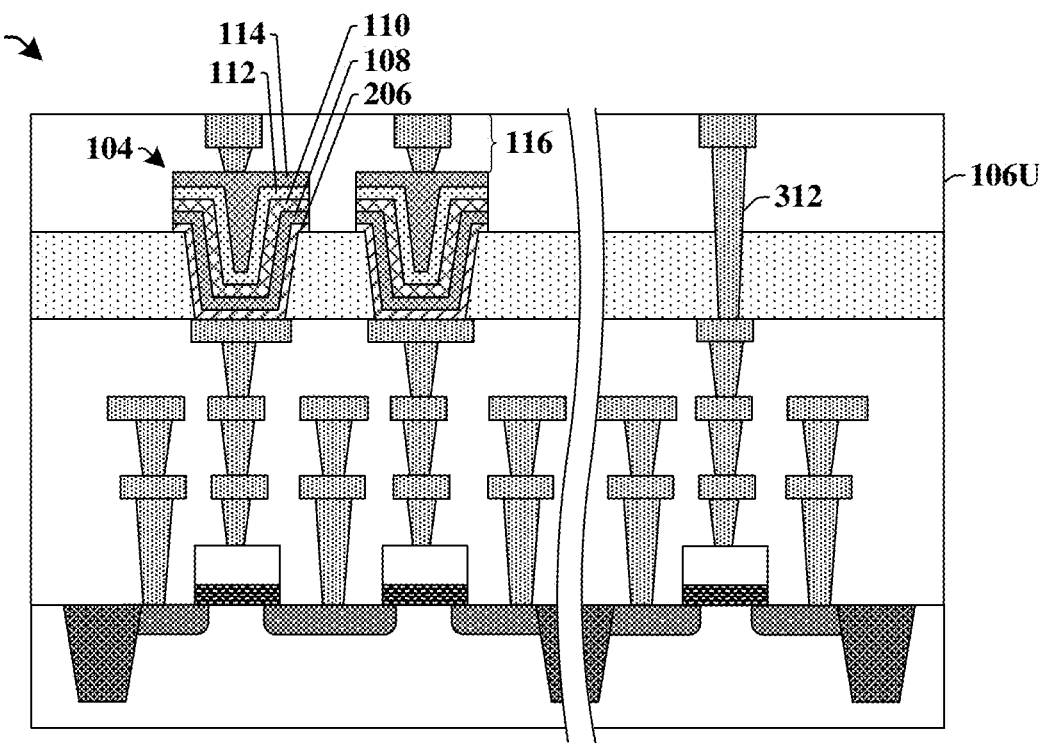

As shown in cross-sectional view 3200 of FIG. 32, an upper interconnect 116 is formed on the upper electrode 114. The upper interconnect 116 extends through the upper ILD layer 106U to the upper electrode 114. In some embodiments, the upper interconnect 116 may be formed as described in relation to FIG. 22. In some embodiments, an interconnect via 312 may also be formed within the logic region 304 to extend through the upper ILD layer 106U to the one or more additional lower interconnects 308.

Figure 33:
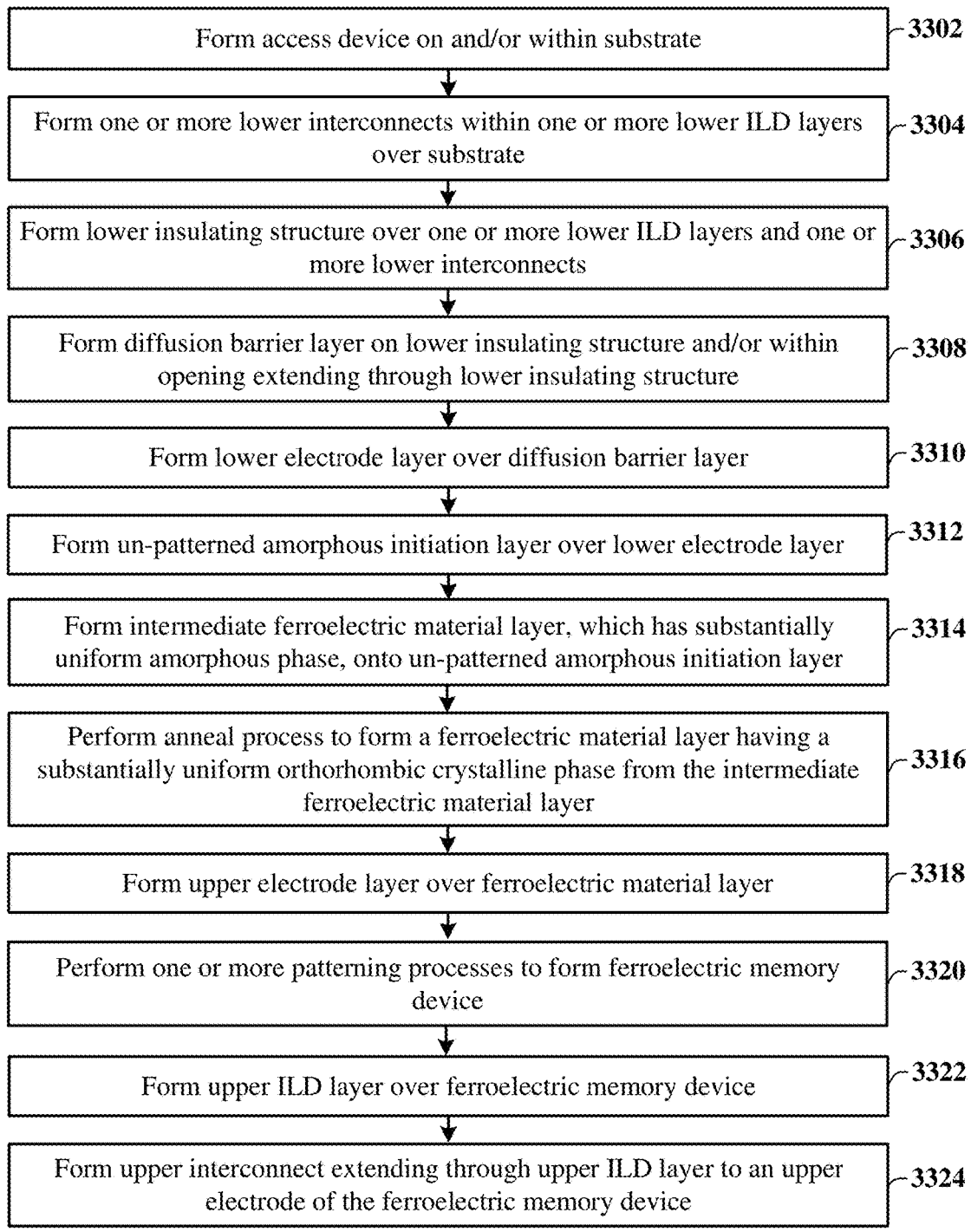
FIG. 33 illustrates a flow diagram of some embodiments of a method of forming an integrated chip having a ferroelectric data storage structure that includes an amorphous initiation layer.

FIG. 33 illustrates a flow diagram of some embodiments of a method 3300 of forming an integrated chip having a ferroelectric data storage structure that includes an amorphous initiation layer.

While the method is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At act 3302, an access device may be formed on and/or within a substrate. FIG. 13 illustrates a cross-sectional view 1300 of some embodiments corresponding to act 3302. FIG. 23 illustrates a cross-sectional view 2300 of an alternative embodiment corresponding to act 3302.

At act 3304, one or more lower interconnects are formed within one or more lower inter-level dielectric (ILD) layers over the substrate. FIG. 14 illustrates a cross-sectional view 1400 of some embodiments corresponding to act 3304. FIG. 24 illustrates a cross-sectional view 2400 of an alternative embodiment corresponding to act 3304.

At act 3306, a lower insulating structure is formed over the one or more lower ILD layers and the one or more lower interconnects. FIG. 15 illustrates a cross-sectional view 1500 of some embodiments corresponding to act 3306. FIG. 25 illustrates a cross-sectional view 2500 of an alternative embodiment corresponding to act 3306.

At act 3308, a diffusion barrier layer is formed on the lower insulating layer and/or within an opening that extends through the lower insulating structure to the one or more lower interconnects. FIG. 16 illustrates a cross-sectional view 1600 of some embodiments corresponding to act 3308. FIG. 26 illustrates a cross-sectional view 2600 of an alternative embodiment corresponding to act 3308.

At act 3310, a lower electrode layer is formed on the diffusion barrier layer. FIG. 16 illustrates a cross-sectional view 1600 of some embodiments corresponding to act 3310. FIG. 26 illustrates a cross-sectional view 2600 of an alternative embodiment corresponding to act 3310.

At act 3312, an un-patterned amorphous initiation layer is formed on the lower electrode layer. FIG. 16 illustrates a cross-sectional view 1600 of some embodiments corresponding to act 3312. FIG. 26 illustrates a cross-sectional view 2600 of an alternative embodiment corresponding to act 3312.

At act 3314, an intermediate ferroelectric switching layer, which has a substantially uniform amorphous phase, is formed on the un-patterned amorphous initiation layer. FIG. 17 illustrates a cross-sectional view 1700 of some embodiments corresponding to act 3314. FIG. 27 illustrates a cross-sectional view 2700 of an alternative embodiment corresponding to act 3314.

At act 3316, an anneal process is performed to change the intermediate ferroelectric switching layer having a substantially uniform amorphous phase to a ferroelectric switching layer having a substantially uniform orthorhombic crystalline phase. FIG. 18 illustrates a cross-sectional view 1800 of some embodiments corresponding to act 3316. FIG. 28 illustrates a cross-sectional view 2800 of an alternative embodiment corresponding to act 3316.

At act 3318, an upper electrode layer is formed on the ferroelectric switching layer. FIG. 19 illustrates a cross-sectional view 1900 of some embodiments corresponding to act 3318. FIG. 29 illustrates a cross-sectional view 2900 of an alternative embodiment corresponding to act 3318.

At act 3320, one or more patterning processes are performed to form a ferroelectric memory device. FIG. 20 illustrates a cross-sectional view 2000 of some embodiments corresponding to act 3320. FIG. 30 illustrates a cross-sectional view 3000 of an alternative embodiment corresponding to act 3320.

At act 3322, an upper ILD layer is formed over the ferroelectric memory device. FIG. 21 illustrates a cross-sectional view 2100 of some embodiments corresponding to act 3322. FIG. 31 illustrates a cross-sectional view 3100 of an alternative embodiment corresponding to act 3322.

At act 3324, an upper interconnect is formed to extend through the upper ILD layer to an upper electrode of the ferroelectric memory device. FIG. 22 illustrates a cross-sectional view 2200 of some embodiments corresponding to act 3324. FIG. 32 illustrates a cross-sectional view 3200 of an alternative embodiment corresponding to act 3324.

Accordingly, in some embodiments, the present disclosure, relates to an integrated chip having a ferroelectric memory device comprising a ferroelectric data storage structure having an amorphous initiation layer that is configured to cause an overlying ferroelectric switching layer to be formed to have a substantially uniform orthorhombic crystalline phase. The substantially uniform orthorhombic crystalline phase improves a ferroelectric response of the ferroelectric switching layer and thereby improves performance of the ferroelectric memory device.

In some embodiments, the present disclosure relates to a method of forming an integrated chip. The method includes forming a lower electrode layer over a substrate; forming an un-patterned amorphous initiation layer over the lower electrode layer; forming an intermediate ferroelectric material layer on the un-patterned amorphous initiation layer, the intermediate ferroelectric material layer formed to have a substantially uniform amorphous phase; performing an anneal process that is configured to change the intermediate ferroelectric material layer to a ferroelectric material layer having a substantially uniform orthorhombic crystalline phase; forming an upper electrode layer over the ferroelectric material layer; performing one or more patterning processes on the upper electrode layer, the ferroelectric material layer, the un-patterned amorphous initiation layer, and the lower electrode layer to form a ferroelectric memory device; forming an upper inter-level dielectric (ILD) layer over the ferroelectric memory device; and forming an upper interconnect extending through the upper ILD layer to contact the ferroelectric memory device. In some embodiments, the method further includes forming the upper electrode layer after performing the anneal process. In some embodiments, the anneal process is performed at a temperature that is in a range of between approximately 250 degrees Celsius (° C.) and approximately 400° C. In some embodiments, the un-patterned amorphous initiation layer includes an oxide or a nitride. In some embodiments, the method further includes forming a second un-patterned amorphous initiation layer onto the intermediate ferroelectric material layer; and patterning the second un-patterned amorphous initiation layer to form the ferroelectric memory device. In some embodiments, the second un-patterned amorphous initiation layer is a same material as the un-patterned amorphous initiation layer. In some embodiments, the second un-patterned amorphous initiation layer is a different material than the un-patterned amorphous initiation layer. In some embodiments, the method further includes forming a second intermediate ferroelectric material layer onto the second un-patterned amorphous initiation layer; and patterning the second intermediate ferroelectric material layer to form the ferroelectric memory device. In some embodiments, the method further includes forming a third un-patterned amorphous initiation layer onto the second intermediate ferroelectric material layer; and patterning the third un-patterned amorphous initiation layer to form the ferroelectric memory device.

In other embodiments, the present disclosure relates to a method of forming an integrated chip. The method includes forming one or more lower interconnects within one or more lower inter-level dielectric (ILD) layers over a substrate; forming a lower insulating structure over the one or more lower ILD layers, the lower insulating structure having sidewalls defining an opening extending through the lower insulating structure; forming a lower electrode layer over the lower insulating structure; forming an un-patterned amorphous initiation layer over the lower electrode layer, the un-patterned amorphous initiation layer having an amorphous phase; forming an intermediate ferroelectric material layer contacting an upper surface of the un-patterned amorphous initiation layer, the un-patterned amorphous initiation layer configured to cause the intermediate ferroelectric material layer to be formed to have a substantially amorphous phase between outermost sidewalls of the intermediate ferroelectric material layer; performing an anneal process that is configured to change the intermediate ferroelectric material layer from the amorphous phase to a ferroelectric material layer having a crystalline phase; forming an upper electrode layer over the ferroelectric material layer; performing one or more patterning processes on the upper electrode layer, the ferroelectric material layer, the un-patterned amorphous initiation layer, and the lower electrode layer to form a ferroelectric memory device; forming an upper inter-level dielectric (ILD) layer over the lower insulating structure; and forming an upper interconnect extending through the upper ILD layer to contact the ferroelectric memory device. In some embodiments, the crystalline phase is an orthorhombic crystalline phase. In some embodiments, the un-patterned amorphous initiation layer includes a first material having a first crystallization temperature and the intermediate ferroelectric material layer includes a second material having a second crystallization temperature that is smaller than the first crystallization temperature. In some embodiments, the method further includes forming the lower electrode layer, the un-patterned amorphous initiation layer, and the intermediate ferroelectric material layer along the sidewalls of the lower insulating structure. In some embodiments, the un-patterned amorphous initiation layer includes silicon oxide, tantalum oxide, aluminum oxide, yttrium oxide, gadolinium oxide, lanthanum oxide, or strontium oxide. In some embodiments, the un-patterned amorphous initiation layer includes silicon nitride, tantalum nitride, or aluminum nitride. In some embodiments, the un-patterned amorphous initiation layer continuously extends from a lower surface contacting the lower electrode layer to the upper surface contacting the intermediate ferroelectric material layer. In some embodiments, the un-patterned amorphous initiation layer is formed to a thickness of less than or equal to approximately 30 Angstroms.

In yet other embodiments, the present disclosure relates to an integrated chip. The integrated chip includes a lower electrode including a first metal disposed over a substrate; an upper electrode including a second metal disposed over the lower electrode; a ferroelectric data storage structure arranged between the lower electrode and the upper electrode, the ferroelectric data storage structure including a ferroelectric switching layer and an amorphous initiation layer separating the ferroelectric switching layer from the lower electrode; the amorphous initiation layer having a structure that is configured to influence a crystalline phase of the ferroelectric switching layer; and the ferroelectric switching layer including a substantially uniform orthorhombic crystalline phase extending between outermost surfaces of the ferroelectric switching layer. In some embodiments the integrated chip further includes one or more lower interconnects disposed within one or more lower inter-level dielectric (ILD) layers over the substrate; a lower insulating structure arranged over the one or more lower ILD layers, the lower insulating structure including one or more sidewalls defining an opening extending through the lower insulating structure; and the amorphous initiation layer being arranged directly between the one or more sidewalls of the lower insulating structure. In some embodiments, the ferroelectric data storage structure includes a second amorphous initiation layer separated from the amorphous initiation layer by the ferroelectric switching layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated chip, comprising:
a lower electrode comprising a first metal disposed over a substrate, the first metal being ruthenium;
an upper electrode comprising a second metal disposed over the lower electrode;
a ferroelectric data storage structure arranged between the lower electrode and the upper electrode, wherein the ferroelectric data storage structure comprises a ferroelectric switching layer, a first amorphous initiation layer contacting a bottom of the ferroelectric switching layer, and a second amorphous initiation layer contacting a top of the ferroelectric switching layer; and
wherein the first amorphous initiation layer comprises tantalum nitride and the second amorphous initiation layer comprises aluminum oxide.

2. The integrated chip of claim 1, wherein the ferroelectric switching layer has a predominantly orthorhombic phase.

3. The integrated chip of claim 1, wherein the ferroelectric data storage structure further comprises a third amorphous initiation layer separated from the second amorphous initiation layer by a second ferroelectric switching layer, the third amorphous initiation layer comprising aluminum oxide.

4. An integrated chip, comprising:
a lower electrode structure disposed over one or more interconnects, the one or more interconnects being arranged within a lower inter-level dielectric (ILD) structure over a substrate;
an amorphous initiation layer having an amorphous phase and physically contacting an upper surface of the lower electrode structure;
a ferroelectric material on the amorphous initiation layer, wherein the ferroelectric material has an orthorhombic crystalline phase;
a second amorphous initiation layer having an amorphous phase and being disposed on the ferroelectric material, the ferroelectric material vertically separating the amorphous initiation layer from the second amorphous initiation layer; and
an upper electrode over the ferroelectric material, wherein the second amorphous initiation layer physically contacts a lower surface of the upper electrode.

5. The integrated chip of claim 4, wherein the amorphous initiation layer comprises an oxide or a nitride.

6. The integrated chip of claim 4, wherein the amorphous initiation layer comprises tantalum nitride and the second amorphous initiation layer comprises aluminum oxide.

7. The integrated chip of claim 4, wherein the second amorphous initiation layer is a same material as the amorphous initiation layer.

8. The integrated chip of claim 4, wherein the second amorphous initiation layer is a different material than the amorphous initiation layer.

9. The integrated chip of claim 4, wherein the ferroelectric material has a substantially uniform orthorhombic crystalline phase that extends between outermost sidewalls and top and bottom surfaces of the ferroelectric material.

10. The integrated chip of claim 4, wherein both the amorphous initiation layer and the second amorphous initiation layer are vertically and directly between a top of the lower electrode structure and a bottom of the upper electrode.

11. The integrated chip of claim 4, further comprising:
a second ferroelectric material disposed on the second amorphous initiation layer and between the lower electrode structure and the upper electrode.

12. The integrated chip of claim 11, further comprising:
a third amorphous initiation layer disposed on the second ferroelectric material and physically contacting a lower surface of the second ferroelectric material; and
wherein the second ferroelectric material continuously extends between the second amorphous initiation layer and the third amorphous initiation layer.

13. The integrated chip of claim 4, wherein the amorphous initiation layer continuously and vertically extends between a top of the lower electrode structure and a lower surface of the ferroelectric material.

14. The integrated chip of claim 4, wherein the amorphous initiation layer has a first crystallization temperature and the ferroelectric material has a second crystallization temperature that is smaller than the first crystallization temperature.

15. An integrated chip, comprising:
a lower electrode disposed over a substrate;
a first ferroelectric material layer disposed over an upper surface of the lower electrode, wherein the first ferroelectric material layer has a substantially uniform crystalline phase that extends between outermost sidewalls and upper and lower surfaces of the first ferroelectric material layer;
a lower amorphous initiation layer physically contacting the upper surface of the lower electrode and the lower surface of the first ferroelectric material layer, wherein the lower amorphous initiation layer has an amorphous phase;
an amorphous initiation layer physically contacting an upper surface of the first ferroelectric material layer, wherein the amorphous initiation layer has an amorphous phase;
a second ferroelectric material layer physically contacting an upper surface of the amorphous initiation layer, wherein the second ferroelectric material layer has the substantially uniform crystalline phase that extends between outermost sidewalls and upper and lower surfaces of the second ferroelectric material layer;
an upper electrode over the second ferroelectric material layer; and
an upper amorphous initiation layer physically contacting an upper surface of the second ferroelectric material layer and a lower surface of the upper electrode, the upper amorphous initiation layer having an amorphous phase, wherein the lower amorphous initial layer is a first material and both the amorphous initiation layer and the upper amorphous initiation layer are a same second material that is different than the first material.

16. The integrated chip of claim 15, wherein the substantially uniform crystalline phase is an orthorhombic crystalline phase.

17. The integrated chip of claim 15, wherein the amorphous initiation layer comprises a first material having a first crystallization temperature greater than approximately 400° C. and the first ferroelectric material layer comprises a second material having a second crystallization temperature that is smaller than the first crystallization temperature.

18. The integrated chip of claim 15, wherein the first ferroelectric material layer, the amorphous initiation layer, and the second ferroelectric material layer are part of a ferroelectric memory cell having a cell width that is less than approximately 135 nanometers.

19. The integrated chip of claim 15, wherein the first material is tantalum nitride and the second material is aluminum oxide.

20. The integrated chip of claim 15, wherein the first material is a nitride and the second material is an oxide.

* * * * *